(12) United States Patent
Liu et al.

(10) Patent No.: US 11,289,376 B2
(45) Date of Patent: Mar. 29, 2022

(54) METHODS FOR FORMING SELF-ALIGNED INTERCONNECT STRUCTURES

(71) Applicant: Taiwan Semiconductor Manufacturing Co., Ltd., Hsin-Chu (TW)

(72) Inventors: Ru-Gun Liu, Hsinchu County (TW); Shih-Ming Chang, Hsinchu (TW); Hoi-Tou Ng, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/892,984

(22) Filed: Jun. 4, 2020

(65) Prior Publication Data
US 2021/0035862 A1 Feb. 4, 2021

Related U.S. Application Data

(60) Provisional application No. 62/881,071, filed on Jul. 31, 2019.

(51) Int. Cl.
| | |
|---|---|
| *H01L 21/768* | (2006.01) |
| *H01L 21/311* | (2006.01) |
| *H01L 21/027* | (2006.01) |
| *H01L 23/522* | (2006.01) |

(52) U.S. Cl.
CPC .... *H01L 21/76897* (2013.01); *H01L 21/0274* (2013.01); *H01L 21/31144* (2013.01); *H01L 21/76816* (2013.01); *H01L 23/5226* (2013.01)

(58) Field of Classification Search
CPC ......... H01L 21/76897; H01L 21/76816; H01L 21/31144; H01L 21/0274; H01L 23/5226; H01L 21/76849; H01L 21/76834; H01L 21/76804; H01L 23/528; H01L 2221/101
See application file for complete search history.

(56) References Cited

U.S. PATENT DOCUMENTS

| | | | |
|---|---|---|---|
| 8,716,841 B1 | 5/2014 | Chang et al. |
| 8,728,332 B2 | 5/2014 | Lin et al. |
| 8,736,084 B2 | 5/2014 | Cheng et al. |
| 8,762,900 B2 | 6/2014 | Shin et al. |
| 8,764,995 B2 | 7/2014 | Chang et al. |
| 8,767,178 B2 | 7/2014 | Lin et al. |

(Continued)

FOREIGN PATENT DOCUMENTS

TW 201913723 A 4/2019

*Primary Examiner* — Karen Kusumakar
(74) *Attorney, Agent, or Firm* — Haynes and Boone, LLP

(57) ABSTRACT

The present disclosure provides a method for forming interconnect structures. The method includes providing a semiconductor structure including a substrate and a conductive feature formed in a top portion of the substrate; depositing a resist layer over the substrate, wherein the resist layer has an exposure threshold; providing a radiation with an incident exposure dose to the resist layer, wherein the incident exposure dose is configured to be less than the exposure threshold of the resist layer while a sum of the incident exposure dose and a reflected exposure dose from a top surface of the conductive feature is larger than the exposure threshold of the resist layer, thereby forming a latent pattern above the conductive feature; and developing the resist layer to form a patterned resist layer.

20 Claims, 37 Drawing Sheets

(56) References Cited

U.S. PATENT DOCUMENTS

| | | |
|---|---|---|
| 8,796,666 B1 | 8/2014 | Huang et al. |
| 8,802,354 B2 | 8/2014 | Chang et al. |
| 8,812,999 B2 | 8/2014 | Liu et al. |
| 8,822,243 B2 | 9/2014 | Yan et al. |
| 8,828,625 B2 | 9/2014 | Lu et al. |
| 8,837,810 B2 | 9/2014 | Chen et al. |
| 8,841,047 B2 | 9/2014 | Yu et al. |
| 8,841,058 B2 | 9/2014 | Chang |
| 8,850,366 B2 | 9/2014 | Liu et al. |
| 8,877,409 B2 | 11/2014 | Hsu et al. |
| 8,895,234 B2 | 11/2014 | Chang et al. |
| 8,906,595 B2 | 12/2014 | Liu et al. |
| 8,945,803 B2 | 2/2015 | Chen et al. |
| 8,954,899 B2 | 2/2015 | Wu et al. |
| 8,987,142 B2 | 3/2015 | Lee et al. |
| 8,987,689 B2 | 3/2015 | Chen et al. |
| 9,012,132 B2 | 4/2015 | Chang |
| 9,028,915 B2 | 5/2015 | Chang et al. |
| 9,046,789 B2 | 6/2015 | Lin et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,128,384 B2 | 9/2015 | Lin et al. |
| 9,134,633 B2 | 9/2015 | Lin et al. |
| 9,146,469 B2 | 9/2015 | Liu et al. |
| 9,153,478 B2 | 10/2015 | Liu et al. |
| 9,184,054 B1 | 11/2015 | Huang et al. |
| 9,213,234 B2 | 12/2015 | Chang |
| 9,223,220 B2 | 12/2015 | Chang |
| 9,230,867 B2 | 1/2016 | Cheng et al. |
| 9,256,123 B2 | 2/2016 | Shih et al. |
| 9,256,133 B2 | 2/2016 | Chang |
| 9,269,537 B2 | 2/2016 | Tseng et al. |
| 9,287,234 B2 | 3/2016 | Wu et al. |
| 9,304,403 B2 | 4/2016 | Lin et al. |
| 9,305,799 B2 | 4/2016 | Chen et al. |
| 9,336,993 B2 | 5/2016 | Yu |
| 9,367,655 B2 | 6/2016 | Shih et al. |
| 9,367,661 B2 | 6/2016 | Jou et al. |
| 9,390,217 B2 | 7/2016 | Wang et al. |
| 9,404,743 B2 | 8/2016 | Chiu et al. |
| 9,501,601 B2 | 11/2016 | Chang et al. |
| 9,529,268 B2 | 12/2016 | Chang et al. |
| 9,529,959 B2 | 12/2016 | Wang et al. |
| 9,536,759 B2 | 1/2017 | Yang et al. |
| 9,548,303 B2 | 1/2017 | Lee et al. |
| 2007/0092810 A1* | 4/2007 | Zaidi ............... G03F 7/70425 430/30 |
| 2013/0285246 A1* | 10/2013 | Chang ............ H01L 21/76838 257/758 |
| 2020/0043969 A1* | 2/2020 | Guan ............... H01L 27/14636 |

\* cited by examiner

METHODS FOR FORMING SELF-ALIGNED INTERCONNECT STRUCTURES

PRIORITY

This application claims priority to U.S. Provisional Patent Application Ser. No. 62/881,071 filed on Jul. 31, 2019, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

ICs are commonly formed by depositing a sequence of material layers, some of which are patterned by a lithography process. It is important that the patterned layers properly align or overlay with adjacent layers. Proper alignment and overlay becomes more difficult in light of the decreasing geometry sizes of modern ICs. For interconnect structures, overlay errors may reduce contact areas (i.e., between vias and metal lines) and introduce electrical resist drifting. In addition, overlay errors may lead to short circuitry that results in chip malfunction. Furthermore, lithography processes are a significant contributor to the overall cost of manufacturing, including processing time and the cost of masks (also referred to as photomasks or reticles) used in the process. Therefore, what is needed is a lithography method to reduce the impact of overlay errors as the process overlay margins shrink with the advancement of technology nodes.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
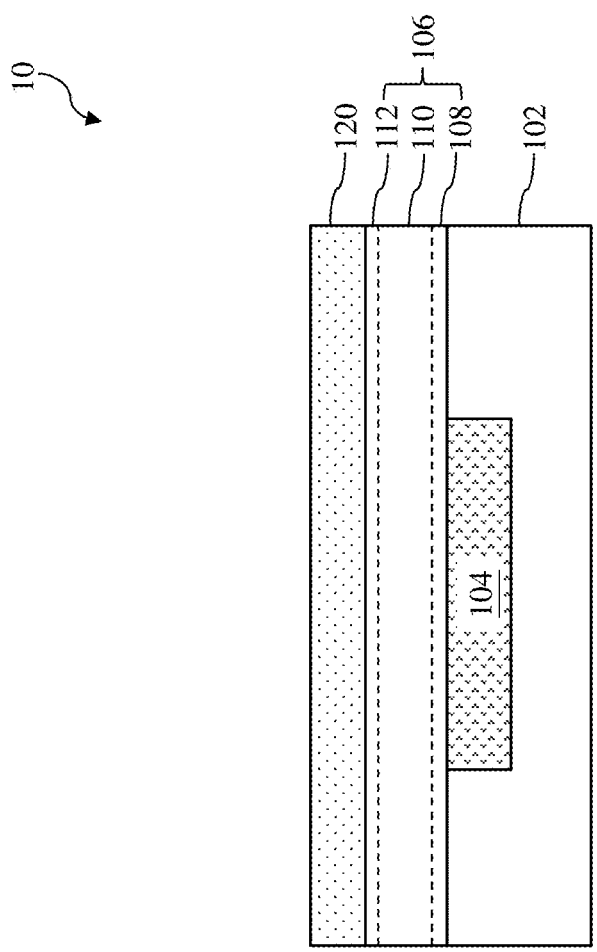
FIG. 1 is a cross-sectional view of a semiconductor structure during a semiconductor fabrication process according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to lithography processes, and more particularly to lithography patterning using self-aligned methods to form interconnect features in a semiconductor structure. Various embodiments discussed herein allow for forming interconnect features having a reduced size and pitch, and allow for reducing or avoiding effects caused by overlay shift during lithography, such as via-induced-metal bridge (VIMB) and via-to-via leakage effects. In some embodiments, the lithography patterning includes exposing a resist layer (also referred to as a photoresist layer) with an exposure dose configured to be less than an exposure threshold of the resist layer such that latent patterns would not be formed by the direct exposure itself. Meanwhile, underneath conductive features reflect a portion of the incident radiation (also referred to as reflected exposure dose) back to the resist layer. The resist layer absorbs both the direct incident exposure dose and the reflected exposure dose. The sum of the incident exposure dose and the reflected exposure dose is configured to be larger than the exposure threshold of the resist layer. Since the reflection happens in a proximate region directly above the underneath conductive features, the latent patterns are self-aligned with the positions of the underneath conductive features. In some embodiments, the underneath conductive features may use high reflective metallic materials or be coated with a reflective layer to increase the reflection strength, which in turn increases the exposure contrast at the edges of the underneath conductive features. It should be noted that various embodiments discussed herein are not limited to forming interconnect features in a semiconductor structure, but may also be used to form other structures having alignment and overlay shift issues.

Referring to FIG. 1, a portion of the semiconductor structure 10 is illustrated. The semiconductor structure 10 includes a semiconductor substrate 102, a conductive feature 104 formed in a top portion of the semiconductor substrate 102, and a dielectric layer 106 over the semiconductor substrate 102.

The semiconductor substrate 102 may include silicon (Si). Alternatively or additionally, the substrate 102 may include other elementary semiconductor such as germanium (Ge). The substrate 102 may also include a compound semiconductor such as silicon carbide, gallium arsenic, indium arsenide, and indium phosphide. The substrate 102 may include an alloy semiconductor such as silicon germanium, silicon germanium carbide, gallium arsenic phosphide, and gallium indium phosphide. In some embodiments, the substrate 102 includes an epitaxial layer. For example, the substrate 102 may have an epitaxial layer overlying a bulk semiconductor. In some embodiments, the substrate 102 may include a semiconductor-on-insulator (SOI) structure. For example, the substrate 102 may include a buried oxide layer formed by a process such as separation by implanted oxygen or other suitable technique, such as wafer bonding and grinding.

The substrate 102 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 102 may further include other functional features such as a resistor or a capacitor formed in and on the substrate. In some embodiments, the substrate 102 may further include lateral isolation features provided to separate various devices formed in the substrate 102. The isolation features may include shallow trench isolation (STI) features to define and electrically isolate the functional features. In some examples, the isolation regions may include silicon oxide, silicon nitride, silicon oxynitride, an air gap, other suitable materials, or combinations thereof. The isolation regions may be formed by any suitable process. The various IC devices may further include other features, such as silicide disposed on S/D and gate stacks overlying channels.

The semiconductor structure 10 may also include a plurality of dielectric layers and conductive features integrated to form interconnect structures configured to couple the various p-type and n-type doped regions and the other functional features (such as gate electrodes), resulting a functional integrated circuit. In some embodiments, the substrate 102 may include a portion of the interconnect structures and is collectively referred to as the substrate 102.

As noted above, the semiconductor structure 10 may include an interconnect structure. The interconnect structure includes a multi-layer interconnect (MLI) structure and an inter-level dielectric (ILD) integrated with the MLI structure, providing an electrical routing to couple various devices in the substrate 102 to the input/output power and signals. The interconnect structure includes various metal lines, contacts and via features (or via plugs). The metal lines provide horizontal electrical routing. The contacts provide vertical connection between the substrate 102 and metal lines. The via features provide vertical connection between metal lines in different metal layers.

Still referring to FIG. 1, the semiconductor structure 10 includes a conductive feature 104. In some embodiments, the conductive feature 104 may include a metal contact, a metal via, or a metal line. In some embodiments, the conductive feature 104 may be further surrounded by a barrier layer (not shown) to prevent diffusion and/or provide material adhesion. In some examples, the conductive feature 104 includes aluminum (Al), copper (Cu) or tungsten (W). The barrier layer may include titanium nitride (TiN), tantalum nitride (TaN), tungsten nitride (WN), titanium silicon nitride (TiSiN) or tantalum silicon nitride (TaSiN). The conductive feature 104 and the barrier layer may be formed by a procedure including lithography, etching and deposition. In some embodiments, the conductive feature 104 includes an electrode of a capacitor, a resistor, or a portion of a resistor. Alternatively, the conductive feature 104 includes a doped region (such as a source or a drain), or a gate electrode (such as a metal gate of a FinFET). In some embodiments, the conductive feature 104 includes a silicide feature disposed on respective source, drain, or gate electrode. The silicide feature may be formed by a self-aligned silicide (salicide) technique.

Still referring to FIG. 1, the semiconductor structure 10 includes a dielectric layer 106 deposited over the semiconductor substrate 102. The dielectric layer 106 may have various material layers, such as an etch stop layer (ESL) 108, a low-k dielectric layer 110, and a hard mask layer (112) formed successively along a direction away from the substrate 102. In some embodiments, the ESL 108 is formed on the conductive feature 104. The ESL 108 may include a dielectric material similar to the dielectric material in the low-k dielectric layer 110. However, the dielectric constant of the ESL 108 may be greater than that of the low-k dielectric layer 110 deposited on the ESL 108. The dielectric material in the ESL 108 may be chosen to have a higher etching selectivity over the low-k dielectric layer 110 for proper subsequent etching process to form via (or contact) trenches. For example, the ESL 108 may have a lower etching rate in comparison with the low-k dielectric layer 110 on the ESL 108 in an etching process. In some embodiments, the ESL 108 may be deposited using any suitable technique, such as chemical vapor deposition (CVD), physical vapor deposition (PVD), atomic layer deposition (ALD), or an epitaxial growing process. In some embodiments, the ESL 108 includes an oxide layer including carbon, oxygen, silicon, and/or other suitable materials, or combinations thereof.

The low-k dielectric layer 110 is formed on the ESL 108. The low-k dielectric layer 110 may be an inter-layer dielectric (ILD) layer or an inter-metal dielectric (IMD) layer. The low-k dielectric layer may include low-k dielectric materials having k values, for example, lower than about 4.0 or even 2.0. In some embodiments, the low-k dielectric layer 110 may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spin-on coating, CVD, plasma-enhanced CVD (PECVD), PVD, or the like.

The hard mask (HM) layer 112 is formed on the low-k dielectric layer 110. The HM layer 112 may include a single material layer, or a plurality of material layers. In some embodiments, the HM layer 112 includes a lower HM layer and an upper HM layer (not shown). The lower HM layer may include a dielectric material similar to the dielectric material of the low-k dielectric layer 110, but with a greater dielectric constant than that of the low-k dielectric layer 110. In some embodiments, the lower HM layer includes an oxide layer including carbon, oxygen, silicon, and/or other suitable materials, and combinations thereof. For example, the lower HM layer includes a silicon oxide ($SiO_2$) layer. The lower HM layer may be formed by a deposition process, such as a CVD process. In some embodiments, the lower HM layer may have a greater hardness than the low-k dielectric layer 110. In some embodiments, the lower HM layer may have a higher polish rate than that of the low-k dielectric layer 110, so that the lower HM layer can be used as a buffer layer in subsequent polishing processes. The upper HM layer is formed on the lower HM layer. In some embodiments, the upper HM layer includes titanium nitride (TiN), titanium oxide ($TiO_2$), and/or other suitable oxide materials, or combinations thereof. In some embodiments, the upper HM layer is formed using any suitable technique, such as CVD, PECVD, or PVD. The upper HM layer may be used to transfer the IC design pattern from a photomask (e.g. photomask 200 in FIG. 2) to the low-k dielectric layer 110. It is to be understood that HM layer 112 may also include a single material layer or alternatively more than two material layers that can be used to transfer one or more IC design patterns from a photomask to the low-k dielectric layer 110.

Still referring to FIG. 1, a photoresist layer 120 is formed on the dielectric layer 106. The photoresist layer 120 may be formed by depositing a photoresist composition over the dielectric layer 106. The photoresist layer 120 may include a photoresist material and a solvent. In some embodiments, the photoresist material includes a polymer. In one example, the molecular weight of the photoresist material may be controlled for the quality of the lithography exposure process. In another example, the molecular weight of the photoresist material is between about 1000 and 20000. In some embodiments, the photoresist layer 120 may further include a quencher and/or other additives.

In some embodiments, the photoresist material of the photoresist layer 120 includes a chemically amplified (CA) resist material. The CA resist material may be a positive CA resist material, which includes an acid cleavable polymer that turns soluble in a developer such as a base solution after the acid cleavable polymer is cleaved by an acid (e.g., an acid generated by photo-acid generator (PAG)). In an example, the acid cleavable polymer cleaved by the acid becomes more hydrophilic, and may be soluble in a base solution. For example, the acid cleavable polymer cleaved by the acid may be soluble in a tetramethylammonium hydroxide (TMAH) developer. In another example, the TMAH developer includes a TMAH solution with a proper concentration ranging about between 0 and 15% by weight. In yet another example, the TMAH developer includes a TMAH solution with a concentration of about 2.38% by weight. In furtherance of the embodiments, when the CA resist material is used, the photoresist material of the photoresist layer 120 may include a photo-acid generator (PAG) distributed in the photoresist layer 120. When absorbing radiation energy, the PAG decomposes and forms a small amount of acid. The PAG may have a concentration ranging between about 1% and 30% by weight of the photoresist layer 120. In some embodiments, the PAG can be ionic type (onium salt), such as metallic or sulfonate. The PAG may alternatively be non-ionic, such as sulfonate ester, 2 nitrobenzyl ester, organohalide, aromatic sulfonate, oxime sulfonate, N-sulfonyloxyimide, sulfonloxy ketone, or diazonaphthoquinone (DNQ) 4 sulfonate. The photoresist layer 120 may additionally include other components, such as a quencher. In an example, the quencher is base type and is capable of neutralizing acid. Collectively or alternatively, the quencher may inhibit other active components of the photoresist layer 120, such as inhibiting photoacid from reaction. Examples of optional additives further include photo decomposable quencher (PDQ), photo base generator (PBG) that may be used to inactivate acid generated by exposure, thermal base generator, thermal acid generator, acid amplifier, chromophore, other suitable materials, and/or a combination thereof.

The photoresist layer 120 may be deposited by spin-on coating or other suitable technique. Other steps, such as baking, may follow the coating of the photoresist layer 120. In some embodiments, the solvent of the photoresist layer 120 may be partially evaporated by a soft baking process.

Figure 2:
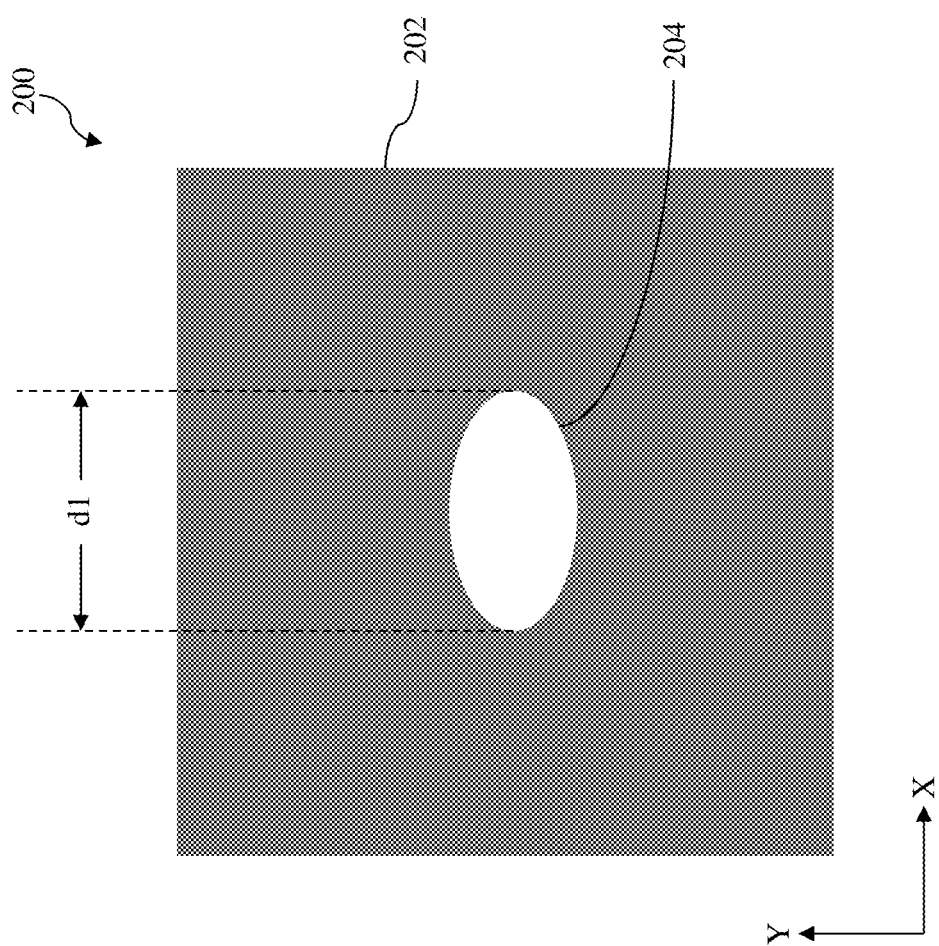
FIG. 2 is a top view of a photomask having an integrated circuit (IC) design pattern according to some embodiments of the present disclosure.

FIG. 2 is a top view of a photomask (also referred to as mask or reticle) 200 having a photomask substrate 202 and an IC design pattern 204 according to some embodiments of the present disclosure. It is to be understood that the photomask 200 and the included IC design pattern 204 may in fact be part of a larger and more complicated photomask (not shown). The photomask 200 may be used to pattern one or more layers during the lithography patterning process. In some embodiments, the IC design pattern 204 may be used for forming interconnect features (e.g., vias, contacts, or plugs) using a lithography process. In the illustrated embodiment, the IC design pattern 204 has an oval shape in the top view, which may be associated with a via feature defined by the IC design pattern 204. The oval shape has a width of d1 in the X direction. In furtherance of the embodiment, the oval shape is associated with a via feature that is formed to connect and electrically coupled to a conductive feature (e.g., a metal line) in a layer below the via, such as the conductive feature 104 formed in the top portion of the semiconductor substrate 102 (FIG. 1).

The photomask 200 includes the photomask substrate 202 and the IC design pattern 204 formed thereon. In some embodiments, when the lithography technique, such as ultraviolet (UV) or deep ultraviolet (DUV), is used for patterning features on the wafer, the photomask substrate 202 includes a transparent substrate, such as fused quartz. The IC design pattern 204 is formed on the photomask substrate 202 and is defined in an opaque material layer, such as chromium (Cr). The photomask 200 allows UV or DUV radiation to penetrate though transparent portions defined by the IC design pattern 204. In some alternative embodiments, when extreme ultraviolet (EUV) lithography technology is used, the photomask 200 is a reflective photomask that is different from the one illustrated in FIG. 2. In an exemplary reflective photomask, the photomask substrate 202 is made of a low thermal expansion material (LTEM), a reflective multilayer is deposited on the substrate 202, and an absorber layer is deposited over the reflective multilayer and is further patterned to define the IC design pattern 204. In EUV lithography, the reflective multilayer reflects EUV radiation and the light path is different from that of UV or DUV lithography. It is to be understood that other configurations and inclusion or omission of various items may be possible. For example, a capping layer may be formed between the reflective multilayer and absorber layer. In another example, a protection layer may be formed on the absorber layer. In yet some alternative embodiments, the photomask 200 may be a phase shift mask (PSM), such as attenuating PSM or alternating PSM, for enhanced imaging resolution.

Alternatively, a lithography technique may be free from using a photomask, such as the photomask 200 in FIG. 2, which is termed as a maskless lithography technique. In an exemplary maskless lithography technique, IC design patterns may be defined in a lithography patterning data file and be transferred to material (e.g., photoresist) layers by other exposing systems, such as a charged particle beam (including electron-beam (E-beam)), in a suitable mode (such as direct writing in raster mode or vector mode, or using a digital pattern generator). In electron-beam lithography, the photoresist layers are often referred to as electron-beam sensitive resist layers.

Figure 3:
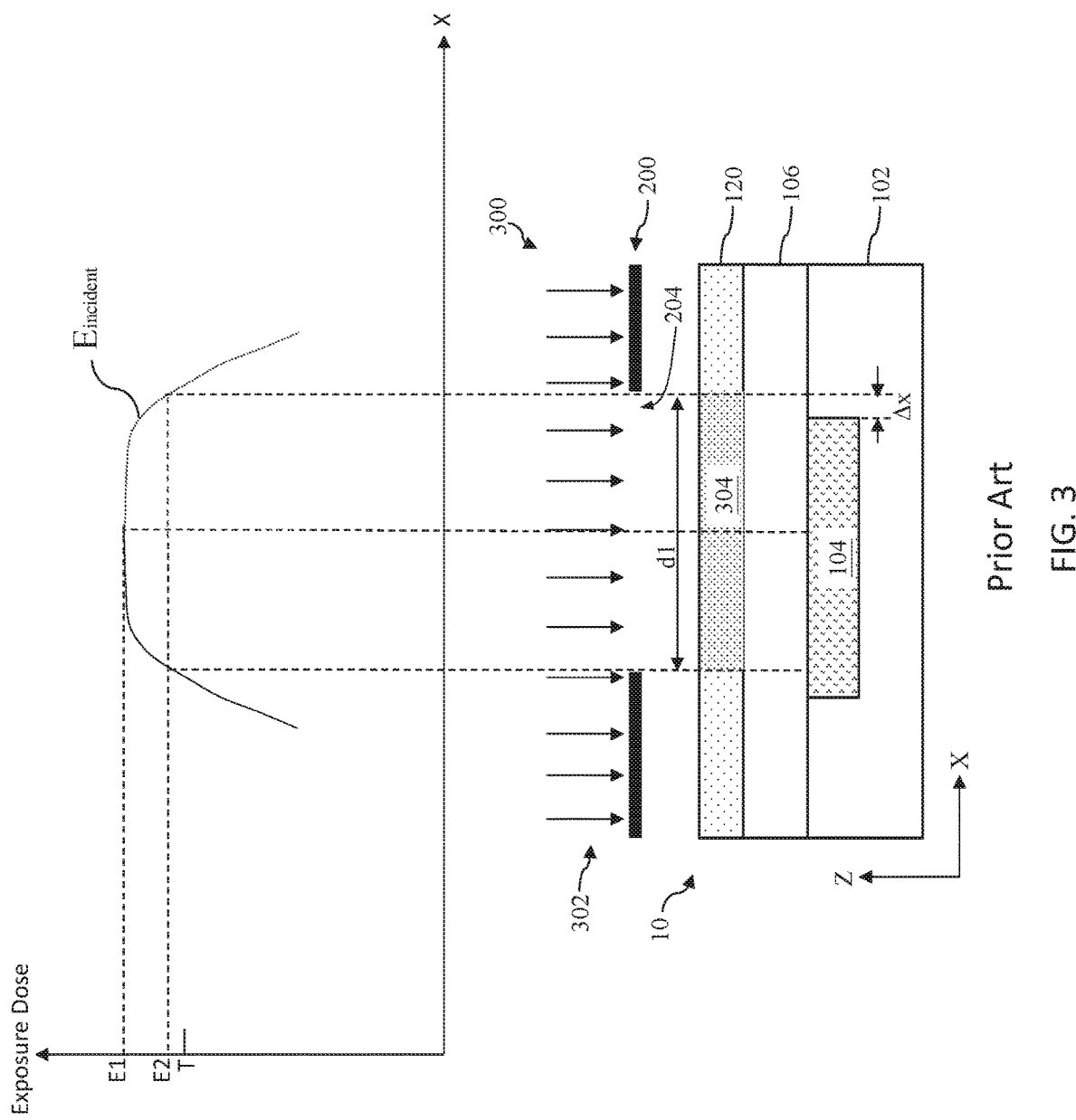
FIGS. 3 and 4 are diagrammatical views of various exposure dose curves during lithography exposure processes according to various embodiments of the present disclosure.

Referring to FIG. 3, a conventional lithography exposure process 300 is illustrated, which is to be compared with an embodiment of a self-aligned lithography exposure process that will be discussed below with respect to FIG. 4. The lithography exposure process 300 uses the photomask 200 having the IC design pattern 204 to expose the photoresist layer 120, thereby forming a latent pattern in a region 304 of the photoresist layer 120. A latent pattern is referred to as a portion of the photoresist layer that is exposed but not developed yet. In the illustrated example, an overlay shift occurs in the X direction, causing a misalignment between the photomask 200 and the conductive feature 104, such that an edge of the IC design pattern 204 is offset from an edge of the conductive feature 104 for a distance of Δx.

Regarding the photoresist material in the photoresist layer 120, it has an exposure threshold to radiation (e.g., UV, DUV, EUV, or E-beam radiation), denoted as T. When the exposing intensity (also referred to as exposure dosage or exposure dose) is equal to or greater than the exposure threshold T, the corresponding portion of the photoresist is chemically changed such that a latent patent is formed, and the latent patent will be developed (e.g., it is removable by a developer) in a developing process. When the exposing intensity is less than the exposure threshold T, the corresponding portion of the photoresist is not chemically changed to be developed (e.g., no latent pattern is formed, and it remains during the developing process). It is understood that the term "chemically changed" means that the photoresist has sufficiently changed to respond differently, e.g., as exposed photoresist responds in the development process. In one example where the photoresist is positive tone, only portions of the photoresist exposed with exposing intensity equal to or greater than the exposure threshold T are removed by a suitable developer during the developing process. Other portions of the photoresist unexposed or exposed with exposing intensity less than the exposure threshold T remain after the developing process. In another example where the photoresist is negative tone, the portions of the photoresist unexposed or exposed with exposing intensity less than the exposure threshold T are removed by a suitable developer during the developing process. Other portions of the photoresist exposed with exposing intensity equal to or greater than the exposure threshold T remain after the developing process.

Still referring to FIG. 3, the exposing intensity under radiation 302, which is emitted from the radiation source directly to the photoresist layer 120, is referred to as incident exposure dose, denoted as $E_{incident}$. $E_{incident}$ has a distribution profile, also known as an exposure dose curve. Also shown in FIG. 3 is an example of the exposure dose curve of $E_{incident}$ to which the photoresist layer 120 is exposed during the lithography exposure process 300. In an example, the exposure dose curve of $E_{incident}$ illustrates the exposure intensity at the bottom surface of the photoresist layer 120. Regions of the photoresist layer 120 closer to the center of the IC design pattern 204 may receive higher exposure dose (e.g., E1) than regions further from the center of the IC design pattern 204 (e.g., E2 near the edge of the IC design pattern 204). Conventionally, the lithography exposure process 300 applies an incident exposure dose larger than the exposure threshold T of the photoresist layer 120. According to the exposure dose curve of $E_{incident}$, the lowest exposure dose received by the region 304 of the photoresist layer 120 is E2. In some embodiments, E2 is greater than or equal to the exposure threshold T of the photoresist layer 120, such that a latent patent is formed in the region 304 under the radiation 302. However, since the exposure dose curve is mainly defined by the radiation intensity from the source together with the geometry of the IC design pattern 204 and substantially irrelevant to the position of the underneath conductive feature 104, the overlay error with the offset Δx is transferred to the position of the latent patent in the region 304 and subsequently would be transferred to an interconnect feature to-be-formed in the dielectric layer 106. The offset Δx may cause the interconnect feature electrically short to other adjacent conductive features in the dielectric layer 106.

Figure 4:
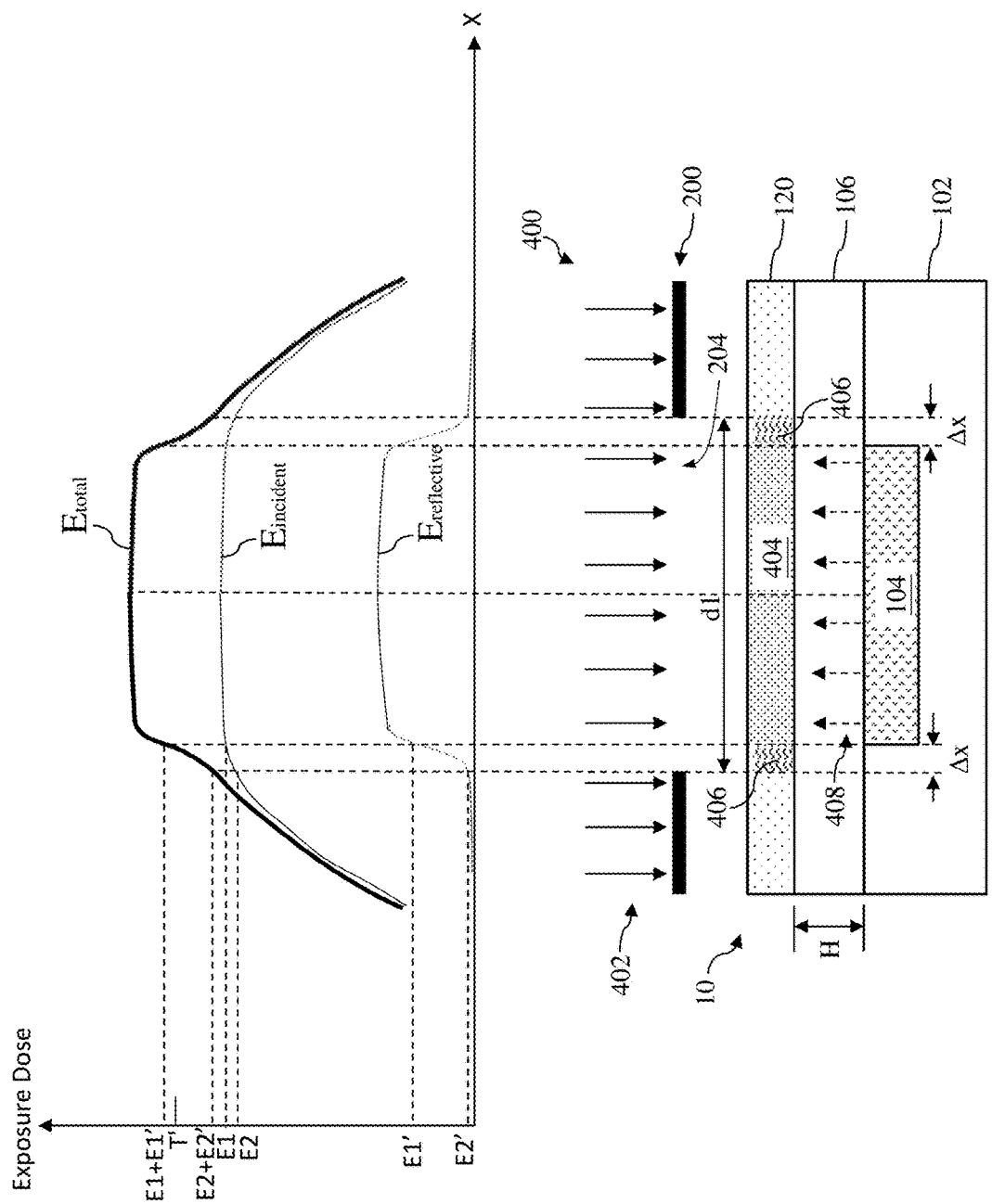

Referring to FIG. 4, an embodiment of a self-aligned lithography exposure process of the present disclosure is illustrated. The lithography exposure process 400 uses the photomask 200 having the IC design pattern 204 to expose the photoresist layer 120, thereby forming a latent patent in the photoresist layer 120. Compared with the latent patent illustrated in FIG. 3, the position of the latent patent in FIG. 4 is defined by the position of the underneath conductive feature 104, such that the latent patent is confined in a region 404 that is substantially directly above the conductive feature 104. Compared with the conventional lithography exposure process 300 in FIG. 3, the position of the latent patent formed in the photoresist layer 120 in FIG. 4 is insensitive to overlay errors, regardless overlay shifts occurred in either positive or negative X direction. To illustrate this, in FIG. 4, the IC design pattern 204 in the photomask 200 is drawn to be larger than the underneath conductive feature 104, such that both edges of the IC design pattern 204 are offset from respective edges of the conductive feature 104 for a distance of Δx.

The photoresist material in the photoresist layer 120 has an exposure threshold T'. The exposing intensity under radiation 402, which is emitted from the radiation source directly to the photoresist layer 120, is denoted as $E_{incident}$. An exposure dose curve of $E_{incident}$ represents its distribution profile. Also shown in FIG. 4 is an example of the exposure dose curve of $E_{incident}$ to which the photoresist layer 120 is exposed during the lithography exposure process 400. In an example, the exposure dose curve of $E_{incident}$ illustrates an exposure intensity at the bottom surface of the photoresist layer 120. One difference compared with the lithography exposure process 300 illustrated in FIG. 3 is that the exposure dose used in the lithography exposure process 400 in FIG. 4 is configured to be less than the exposure threshold T'. Even though regions of the photoresist layer 120 closer to the center of the IC design pattern 204 may receive higher exposure dose (e.g., E1 near the edge of the conductive feature 104) than regions further from the center of the IC design pattern 204 (e.g., E2 near the edge of the IC design pattern 204), the whole exposure dose curve of $E_{incident}$ is below the exposure threshold T' (i.e., E1<T' and E2<T'). Accordingly, the exposure dose emitted from the radiation source directly to the photoresist layer 120 is not strong enough to form a latent pattern.

Yet another difference compared with the lithography exposure process 300 in FIG. 3 is that the underneath conductive feature 104 in FIG. 4 has a higher reflectivity with respect to the incident radiation 402 at its top surface, which has substantial impact on the total radiation received by the photoresist layer 120. The term "reflectivity" means a fraction of incident radiation that is reflected at an interface, denoted as R. With respect to the lithography exposure process 300 illustrated in FIG. 3, the reflectivity R may be small, such as less than about 5%, and the reflected radiation can be ignored. For example, under a DUV radiation at a wavelength of 193 nm, copper (Cu) has a reflectivity of about 2% (R≈2%). That is, if the conductive feature 104 is made of Cu, about 2% of the incident DUV radiation arriving at the top surface of the conductive feature 104 would be reflected back to above layers. The total radiation received by the photoresist layer 120 is the sum of the incident radiation and the reflected radiation. But for copper, since the reflected radiation is merely 2% of the incident radiation, a small fraction that often can be ignored, the total radiation remains dominated by the strength of the incident radiation.

While metallic materials like copper may have poor reflectivity under certain radiation (e.g., under 193 nm DUV radiation, for Au, R<1%; for Ni, R≈2%; for Cr, R≈1%), some other metallic materials or alloys may exhibit stronger reflectivity. For example, under a DUV radiation at a wavelength of 193 nm, aluminum (Al) has a reflectivity of about 65%, and an alloy of Al and Cu (AlCu) may reach a reflectivity of about 71%. That is, if the conductive feature 104 is made of Al, about 65% of the incident DUV radiation arriving the top surface of the conductive feature 104 would be reflected back to above layers. In the illustrated embodiment in FIG. 4, the conductive feature 104 has a reflectivity at least about 5%. As discussed above, for a reflectivity less than about 5%, the reflected radiation is hard to have substantial impact on the strength of the total radiation.

Still referring to FIG. 4, the intensity of the reflected radiation 408 from the top surface of the conductive feature 104 back to the photoresist layer 120 is denoted as $E_{reflective}$. $E_{reflective}$ has a distribution profile, also referred to as reflective exposure dose curve. Also shown in the example of FIG. 4 is the reflective exposure dose curve of $E_{reflective}$ to which the photoresist layer 120 is exposed from the underneath conductive feature 104. In an example, the reflective exposure curve of $E_{reflective}$ illustrates an exposure intensity at the bottom surface of the photoresist layer 120, which is distant from the conductive feature by the thickness of the dielectric layer 106 (denoted as H). In various embodiments, the thickness H may range from about 1 nm to about 100 nm, such as about 10 nm.

According to the illustrated reflective exposure dose curve of $E_{reflective}$ in FIG. 4, regions of the photoresist layer 120 directly above the conductive feature 104 (e.g., E1' at the edges of the conductive feature 104) receive higher reflective exposure dose than regions offset from the edges of the conductive feature 104 (e.g., E2' at the edges of IC design pattern 204). Since $E_{reflective}$ is a fraction of $E_{incident}$, the reflective exposure dose curve of $E_{reflective}$ is below the exposure dose curve of $E_{incident}$, which is further below the exposure threshold T'.

The total exposure dose received by the photoresist layer 120, denoted as $E_{total}$, is a sum of the incident exposure dose $E_{incident}$ and reflected exposure dose $E_{reflective}$ ($E_{total}=E_{incident}+E_{reflective}$). The total exposure dose curve of $E_{total}$ is also shown in FIG. 4. At the edges of the conductive feature 104, the total exposure dose is about E1+E1'. At the edges of the region 404, which are offset from the edges of the conductive feature 104, the total exposure dose is about E2+E2'.

In the lithography exposure process 400, the incident radiation directly from the radiation source is configured such that E1+E1' is larger than or equal to the exposure threshold T', such that a latent pattern is formed in the region 404 directly above the conductive feature 104, while E2+E2' is less than the exposure threshold T', such that latent patterns would not be formed in transitional regions 406 that are offset from the conductive feature 104. By taking the reflected exposure dose into effect to shift the total exposure dose from otherwise below the exposure threshold T' to above the exposure threshold T', the latent pattern formed in the region 404 is self-aligned with the underneath conductive feature 104. Accordingly, by defining the position of the latent pattern, the interconnect features to be formed subsequently in the dielectric layer 106 will be substantially self-aligned with the underneath conductive feature 104 as well.

A greater exposure contrast provides more design flexibility in a lithography process. The exposure contrast, denoted as γ, refers to a slope of an exposure dose curve in a transitional region of a photoresist layer. The exposure contrast γ describes the ability of the resist to distinguish between light and dark areas. Regarding the exposure dose curve of $E_{total}$, the exposure contrast γ at the transitional region 406 can be proximately expressed as the difference between the total exposure doses at the edge of the conductive feature 104 (about E1+E1') and at the edge of the IC design pattern 204 (about E2+E2') divided by the offset distance Δx, which is γ≈(E1+E1'−E2−E2')/Δx. Since the difference between the incident exposure doses E1 and E2 is small (E1≈E2) as both E1 and E2 are exposure doses directly under the IC design pattern 204, the expression of exposure contrast γ can be further simplified as γ≈(E1'−E2')/Δx. In other words, the exposure contrast γ is mainly defined by the slope of the reflective exposure dose curve of $E_{reflective}$.

To increase the slope of the reflective exposure dose curve of $E_{reflective}$ in transitional regions 406 in order to enhance the exposure contrast γ, one way is to increase the reflectivity R at the top surface of the conductive feature 104, such as by forming the conductive feature 104 with a metallic material with high reflectivity. With higher reflectivity, the reflected exposure dose curve in center regions directly above the conducive feature 104 will be shifted further up and thus rolling off faster outside the edges of the conductive feature 104.

Figure 5A:
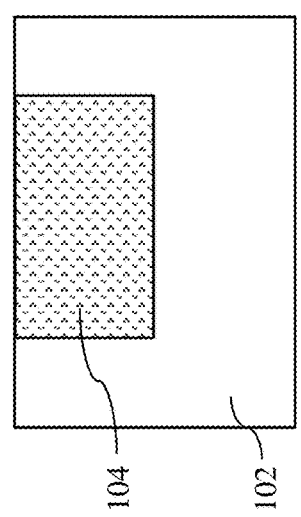
FIGS. 5A, 5B, and 5C are cross-sectional views of conductive features with high reflectivity according to some embodiments of the present disclosure.
Figure 5B:
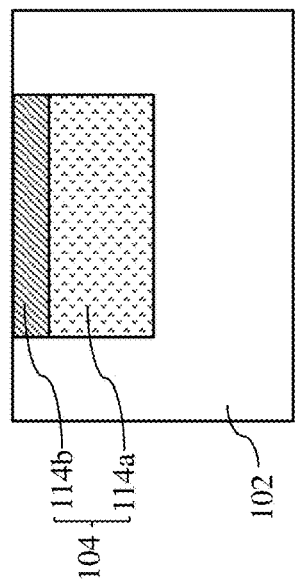
Figure 5C:
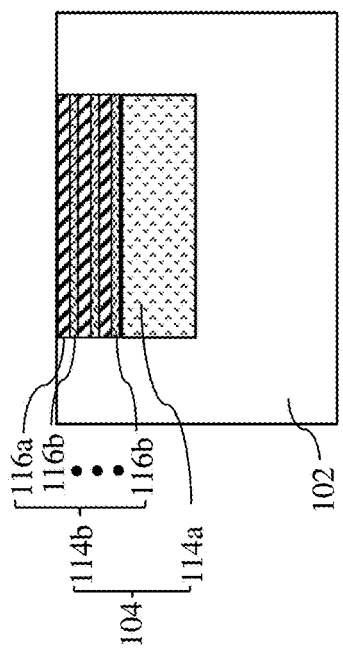

FIGS. 5A-C illustrate various embodiments of the conductive feature 104. In some embodiments, the conductive feature 104 is a uniform layer of a bulk metallic material that has high reflectivity, such as Aluminum (Al), Tantalum (Ta), Titanium (Ti), or a metallic alloy, such as AlCu, as shown in FIG. 5A.

In some other embodiments, the conductive feature 104 has a bilayer arrangement with a bulk metal layer 114a at the bottom portion of the conductive feature 104 and a reflective layer 114b coated on the bulk metal layer 114a, as shown in FIG. 5B. The bulk metal layer 114a may include a metallic material with relatively high conductivity but low reflectivity, such as Copper (Cu), Gold (Au), Tungsten (W), Chromium (Cr), Cobalt (Co), Nickel (Ni). The reflective layer 114b is formed of materials with high reflectivity, such as Al, Ta, Ti, AlCu, TiN, $CrSi_2$, or other suitable material. The reflective layer 114b may be conductive, or alternatively non-conductive. As will be explained in further detail below, when the reflective layer 114b is non-conductive, an extra etching step may be applied to the reflective layer 114b to expose the underneath bulk metal layer 114a during lithography processes.

In some other embodiments, the reflective layer 114b coated on the bulk metal layer 114a is a reflective multilayer, such as a plurality of alternating layers of a first material layer 116a and a second material layer 116b, as shown in FIG. 5C. The reflective multilayer is configured to effectively reflect radiation at a predetermined range of wavelength, such as deep ultraviolet (DUV) (from about 100 nm to about 300 nm) or EUV (from about 13.2 nm to about 13.8 nm). For example, the reflective layer 114b may include a plurality of alternating layers of a relatively high refractive index for radiation scattering and a relatively low refractive index for radiation transmitting. Pairing these two type materials together provides a resonant reflectivity. In some embodiments, the reflective multilayer configuration includes multiple molybdenum/silicon (Mo/Si) pairs (e.g., a layer of Mo above or below a layer of Si in each pair) or multiple molybdenum compound/silicon compound pairs. In some embodiments, the reflective multilayer 114b includes multiple molybdenum/beryllium (Mo/Be) pairs or other appropriate material pairs (e.g., Ru/Si pairs, Pd/Si pairs, or Rh/Si pairs) that have refractive index difference to cause a high reflectivity (e.g., from about 10% to about 60%) to a selected radiation. In some embodiments, each layer of the reflective multilayer has a thickness from about 2 nm to about 5 nm. The thickness is adjusted to achieve a maximum constructive interference of the selected radiation diffracted at each interface and a minimum absorption of the selected radiation thereof. In furtherance of some embodiments where the reflective multiplayer 114b includes Mo/Si pairs, a layer of silicon or silicon compound may have a thickness about 4 nm and a layer of molybdenum or molybdenum compound may have a thickness about 3 nm. In some embodiments, the reflective multilayer 114b includes a number of pairs from about 3 to about 20. A number of pairs fewer than 3 decreases a reflectivity, in some instances. A number of pairs greater than 20 increases a likelihood of contacting foreign particles and/or an occurrence of defects, in some instances. In some embodiments where the reflective multilayer 114b includes Mo/Si pairs, a number of pairs is from about 3 to 10, such as 4. In at least one embodiment, the conductive feature 104 further includes a backside coating layer (not shown) stacked between the reflective multilayer 114b and the bulk metal layer 114a. In some instances, the backside coating layer is a metallic film or a polycrystalline silicon film.

Referring back to FIG. 4, to enhance the exposure contrast γ, besides increasing the reflectivity of the underneath conductive feature 104, the inventors of the present disclosure have also observed that a distance between the photoresist layer 120 and the conductive feature 104 (i.e., defined by the thickness H of the dielectric layer 106) is a tuning factor.

Figure 6:
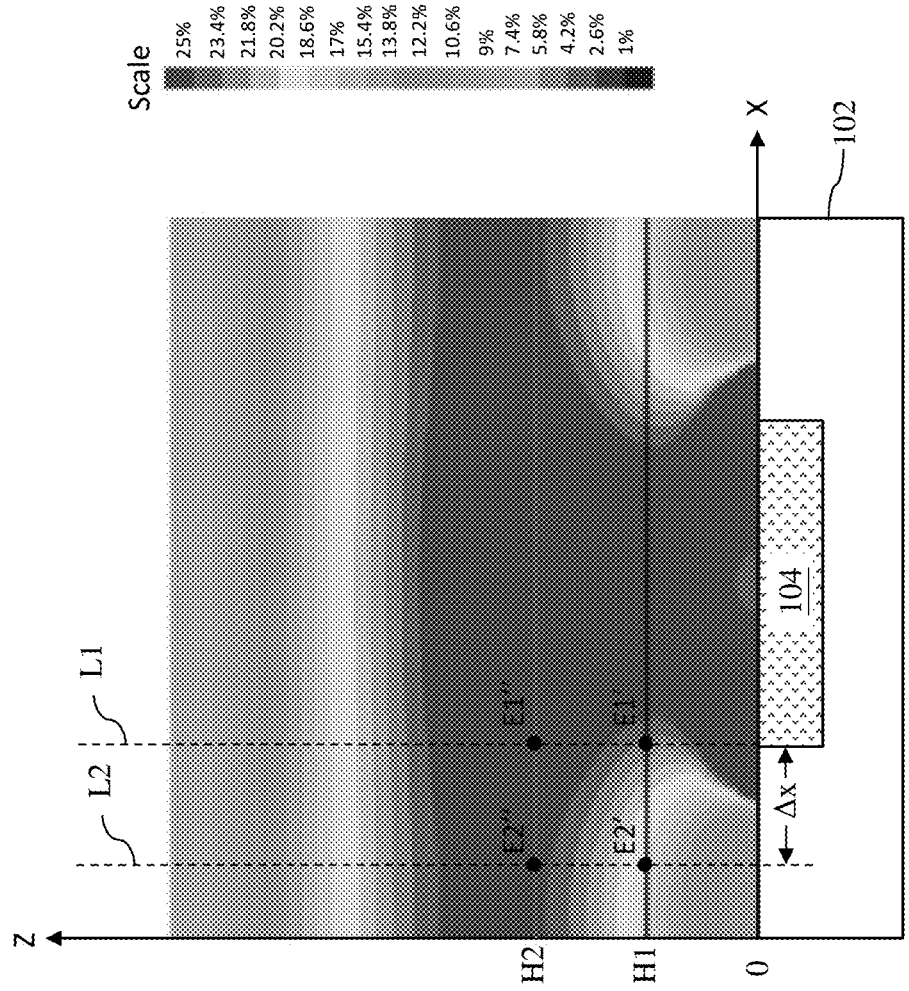
FIG. 6 is a diagrammatical view of reflected exposure dose intensity distribution in a region above a semiconductor device during a lithography exposure process according to some embodiments of the present disclosure.

Referring to FIG. 6, a diagrammatical view of reflected exposure dose intensity distribution in a region above the conductive feature 104 according to some embodiments of the present disclosure is illustrated. The coordination is set at the top surface of the conductive feature 104 (Z=0). In the illustrated embodiment, the top surface of the conductive feature 104 has a reflectivity R about 25%. FIG. 6 also includes a reflected exposure dose intensity scale marked with various intensity levels represented by various grey scales. In the present example, for simplicity, the unit for the exposing intensity is a relative unit in percentage, ranging from 0 to 100%. In this case, "25%" stands for the reflected exposure dose is at 25% of the incident exposure dose from the exposing system. Along line L1 which is perpendicular to the top surface of the substrate 102 and aligned with an edge of the conductive feature 104, the reflected exposure dose generally decreases at a larger vertical distance from the conductive feature 104. In the illustrated embodiment in FIG. 6, for example, at Z=0, the reflected exposure dose is about the same as the reflectivity R, at about 25%; at Z=H1, the reflected exposure dose (E1') becomes smaller, at about 23%; at Z=H2, which is further away from the conductive feature 104, the reflected exposure dose (E1") further decreases to about 22%. However, a decreasing relationship between reflected exposure dose and a vertical distance may not be the case at other locations, because the energy of the reflected radiation generally is not linearly distributed in space considering diffraction and interference effects. For example, along line L2 which is also perpendicular to the top surface of the substrate 102 but offset from the conductive feature 104 at a distance of Δx, when the distance from the conductive feature 104 increases, the reflected exposure dose does not decrease monotonically. Contrarily, the reflected exposure dose may inversely increase at a larger distance. For example, along line L2, at Z=0, the reflected exposure dose is at its minimum, about 12%; at Z=H1, the reflected exposing dose intensity (E2') increases to about 18%; at Z=H2, which is further away from the conductive feature 104, the reflected exposure dose (E2") further increases to about 21%.

As discussed above, an expression of the exposure contrast γ can be simplified as γ≈(E1'−E2')/Δx. At Z=H1, γ≈(23%−18%)/Δx=5%/Δx; at Z=H2, γ≈(22%−21%)/Δx=1%/Δx, which is significantly smaller than γ at Z=H1. Accordingly, to increase the slope of the reflective exposure dose curve of $E_{reflective}$, a distance between the photoresist layer 120 and the conductive feature 104 (i.e., defined by the thickness H of the dielectric layer 106) is a tuning factor and often needs to be less than a threshold distance $H_{th}$. That is, in a self-aligned lithography process, the photoresist layer may need to be spaced from the underneath reflective conductive feature for a distance smaller than a threshold distance $H_{th}$. The threshold distance $H_{th}$ is affected by multiple factors, such as radiation wavelength, reflectivity of the conductive features, geometry of the photomask. In some embodiments, under a DUV radiation, a threshold distance $H_{th}$ may range from about 5 nm to about 20 nm, such as about 10 nm. In some embodiments, under an EUV radiation, a threshold distance $H_{th}$ may range from about 1 nm to about 10 nm, such as about 5 nm.

In various embodiments, by properly choosing the incident exposure dose, adjusting position of the photoresist layer relative to the underneath conductive features, choosing reflectivity of underneath conductive features, adjusting exposure threshold through tuning the composition of the photoresist materials, or a combination thereof, latent patterns that are self-aligned to underneath conductive features can be formed as illustrated in the present disclosure. Further, in some embodiments, the lithography exposure process uses photons, such as UV, DUV or EUV radiation. In an alternative embodiment, charged particles are used as radiation beam during the lithography exposure process. In this case, the IC design pattern may be defined in a data file and the sensitive resist material is chosen to be sensitive to the charged particles, such as E-beam.

The methods of forming self-aligned interconnect features and the semiconductor structures made thereby are further described below according to various embodiments.

Figure 7:
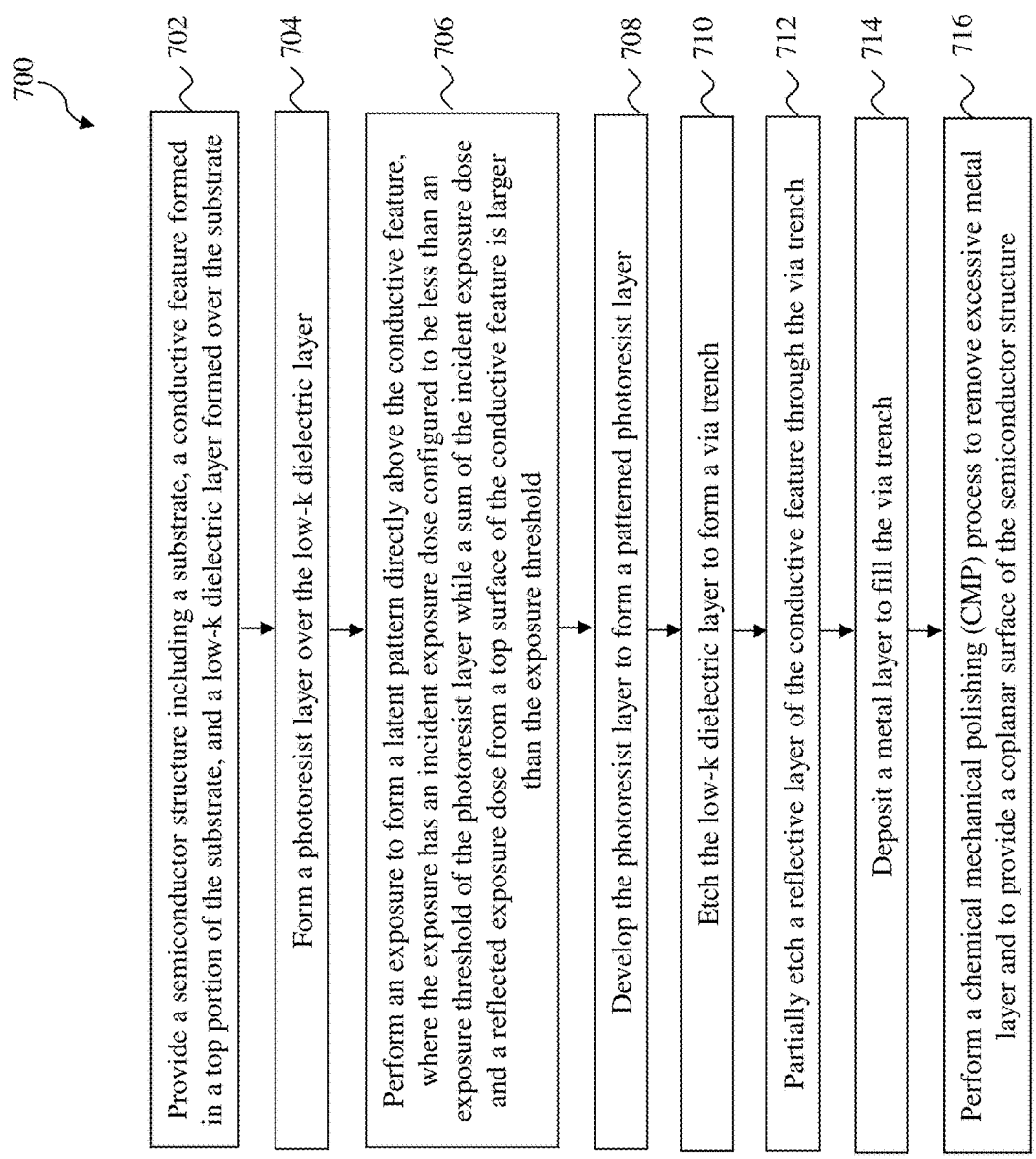
FIG. 7 is a flowchart of a method for making a semiconductor structure with self-aligned interconnect structures according to some embodiments of the present disclosure.

FIG. 7 is a flowchart of a method 700 for making a semiconductor structure using a self-aligned lithography exposure process according to one or more embodiments of the present disclosure. The method 700 is merely an example, and is not intended to limit the present disclosure beyond what is explicitly recited in the claims. Additional steps can be provided before, during, and after method 700, and some of the steps described can be moved, replaced, or eliminated for additional embodiments of method 700. FIG. 7 will be described below in conjunction with FIGS. 8-18, which are cross sectional views of a semiconductor structure 20 at various fabrication stages according to method 700.

The semiconductor structure 20 may be an intermediate device fabricated during processing of an integrated circuit (IC), or a portion thereof, that may comprise static random access memory (SRAM) and/or logic circuits, passive components such as resistors, capacitors, and inductors, and active components such as p-type FETs (pFETs), n-type FETs (nFETs), FinFETs, metal-oxide semiconductor field effect transistors (MOSFET), and complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

Figure 8:
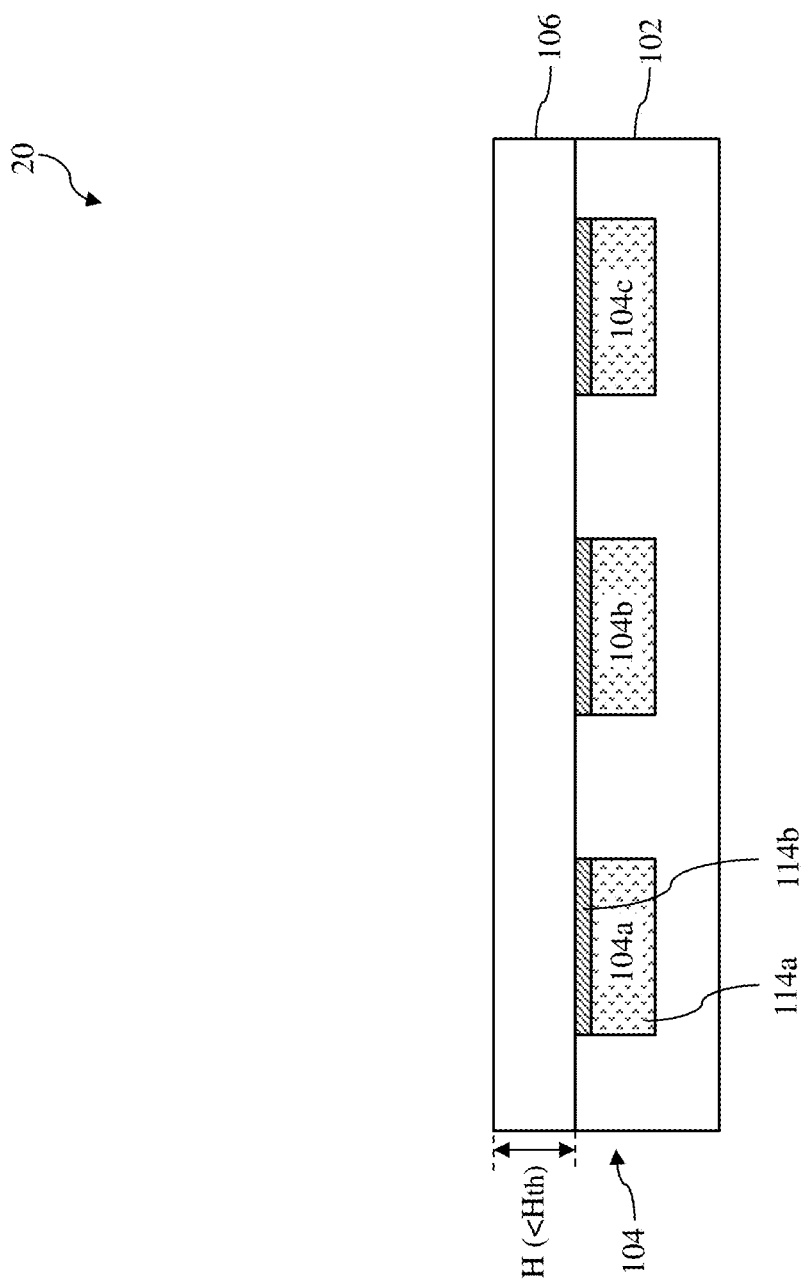
FIGS. 8, 9, 10, 11, 12, 13, 14, 15, 16, 17, and 18 are cross-sectional views of a semiconductor structure using a single lithography patterning process according to some embodiments of the present disclosure.

At operation 702, the method 700 (FIG. 7) provides the semiconductor structure 20, as shown in FIG. 8. The various compositions and material layers of the semiconductor structure 20 are similar to what have been discussed above with reference to the semiconductor structure 10 in FIG. 1 and will be briefly discussed below for the sake of convenience. Reference numerals are repeated for ease of understanding. The semiconductor structure 20 includes a semiconductor substrate 102, a plurality of conductive features 104a-c (collectively as conductive features 104) formed in a top portion of the semiconductor substrate 102, and a dielectric layer 106 over the semiconductor substrate 102. As will be discussed below, in the illustrated embodiment, interconnect features (e.g., vias, contacts, or plugs) will be formed to contact and electrically couple with the conductive features 104a and 104b, but not on the conductive feature 104c. The conductive feature 104c may be part of an intra-layer routing or have interconnect features elsewhere.

In one embodiment, the semiconductor substrate 102 is a silicon substrate. The semiconductor substrate 102 may comprise another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 102 is a semiconductor on insulator (SOI).

The semiconductor substrate 102 includes a plurality of conductive features 104. The conductive features 104 may be IC features such as metal lines, metal contacts, or metal vias. In some embodiments, the conductive features 104 include electrodes of capacitors or resistors. Alternatively, the conductive features 104 may include doped regions (such as source or drain), or gate electrodes (such as metal gates of FinFETs).

The conductive features 104 comprise conductive material compositions, such as highly-conductive metal, low-resistive metal, elemental metal, transition metal, or the like. In some embodiments, the conductive features 104 may be further surrounded by a barrier layer to prevent diffusion and/or provide material adhesion. The conductive features 104 may be deposited by electroplating techniques, although any method of formation could alternatively be used. In an embodiment, the conductive features 104 includes metallic material of relatively high reflectivity, such as Al, Ta, Ti, or metallic alloy, such as AlCu, which is similar to what have been discussed above with reference to the conductive feature 104 in FIG. 5A. In another embodiment, the conductive features 104 have a bilayer arrangement with a bulk metal layer 114a and a reflective layer 114b coated on the bulk metal layer 114a, which is similar to what have been discussed above with reference to the conductive feature 104 in FIG. 5B. The bulk metal layer 114a may be formed of Cu, although other materials, such as W, Al, Au, or the like, could alternatively be utilized. The reflective layer 114b is formed of materials with relatively high reflectivity, such as Al, Ta, Ti, AlCu, TiN, $CrSi_2$, or other suitable material. The reflective layer 114b may be conductive, or alternatively non-conductive. In yet another embodiment, the reflective layer 114b may be a reflective multilayer, such as a plurality of alternating layers of a first material layer and a second material layer, which is similar to what have been discussed above with reference to the reflective layer 114b in FIG. 5C.

The dielectric layer 106 may have various material layers formed on the substrate 102, such as an etch stop layer (ESL), a low-k dielectric layer (e.g., ILD layer or IMD layer), and a hard mask layer formed successively along a direction away from the substrate 102, which is similar to what have been discussed above with reference to the ESL 108, low-k dielectric layer 110, and hard mask layer 112 in FIG. 1. In various embodiments, the dielectric layer 106 has a thickness H that is smaller than the threshold distance $H_{th}$ determined in the subsequent lithography exposure process. For a lithography exposure process using a DUV radiation, the thickness $H_{th}$ may range from about 5 nm to about 20 nm, such as about 10 nm. In an example that $H_{th}$ is about 10 nm, H may range from about 5 nm to about 10 nm, such as about 8 nm. For a lithography exposure process using an EUV radiation, the thickness $H_{th}$ may range from about 1 nm to about 10 nm, such as about 5 nm. In an example that $H_{th}$ is about 5 nm, H may range from about 1 nm to about 5 nm, such as about 3 nm.

Figure 9:
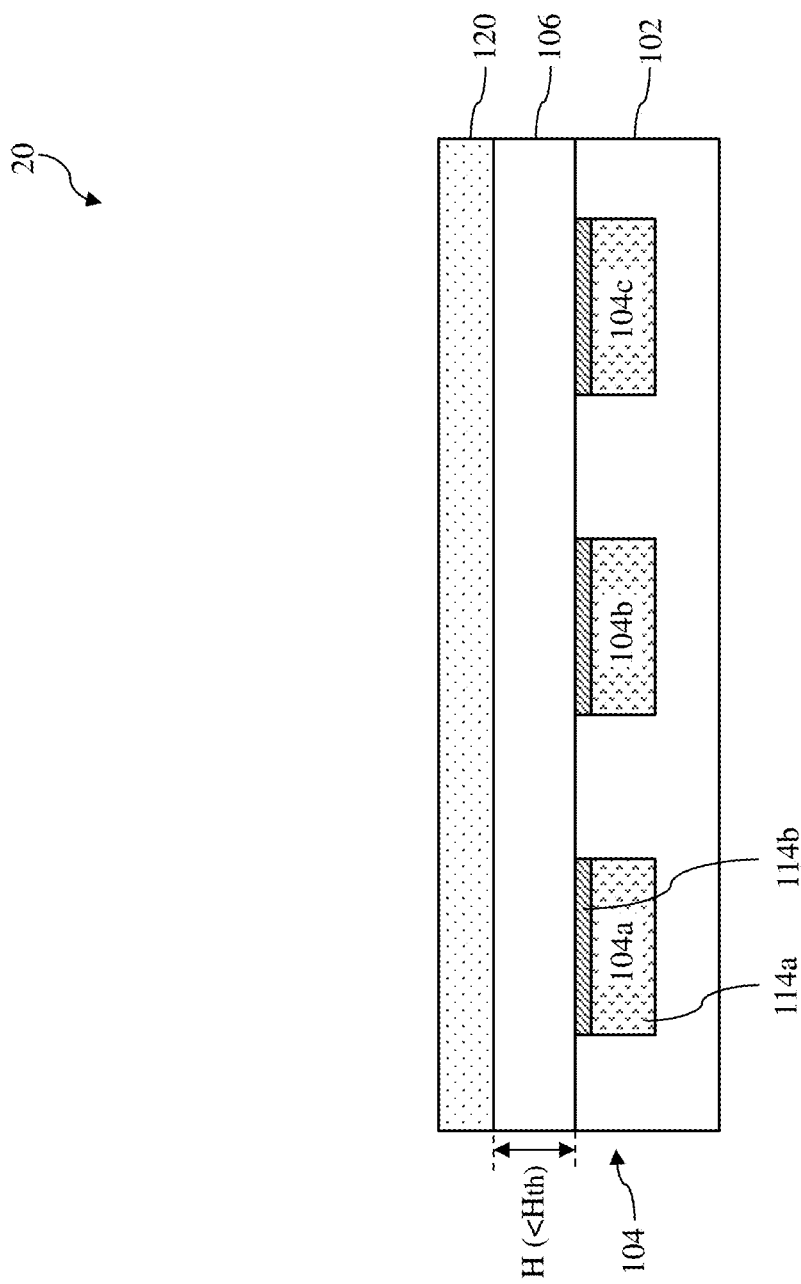

At operation 704, the method 700 (FIG. 7) forms a photoresist layer 120 over the dielectric layer 106, as shown in FIG. 9. Forming of the photoresist layer 120 includes coating the photoresist solution on the dielectric layer 106 by a suitable technique, such as spin-on coating. Other manufacturing steps, such as soft baking may be further applied to the photoresist layer 120. The photoresist layer 120 may include a positive photoresist material that may become dissolvable to the developer solution after exposing to the radiation source. In some alternative embodiments, the photoresist layer 120 may include a negative photoresist material that becomes indissolvable to the developer solution after exposing to the radiation source. The photoresist layer 120 has a predetermined exposure threshold. The composition of the photoresist layer 120 may be adjusted, for example, by changing the ratio of carbon, hydrogen and oxygen, to have a suitable exposure threshold for the lithography exposure process as discussed later in the present disclosure. The photoresist layer 120 may have a thickness in a range from about 200 Å to about 800 Å.

Figure 10:
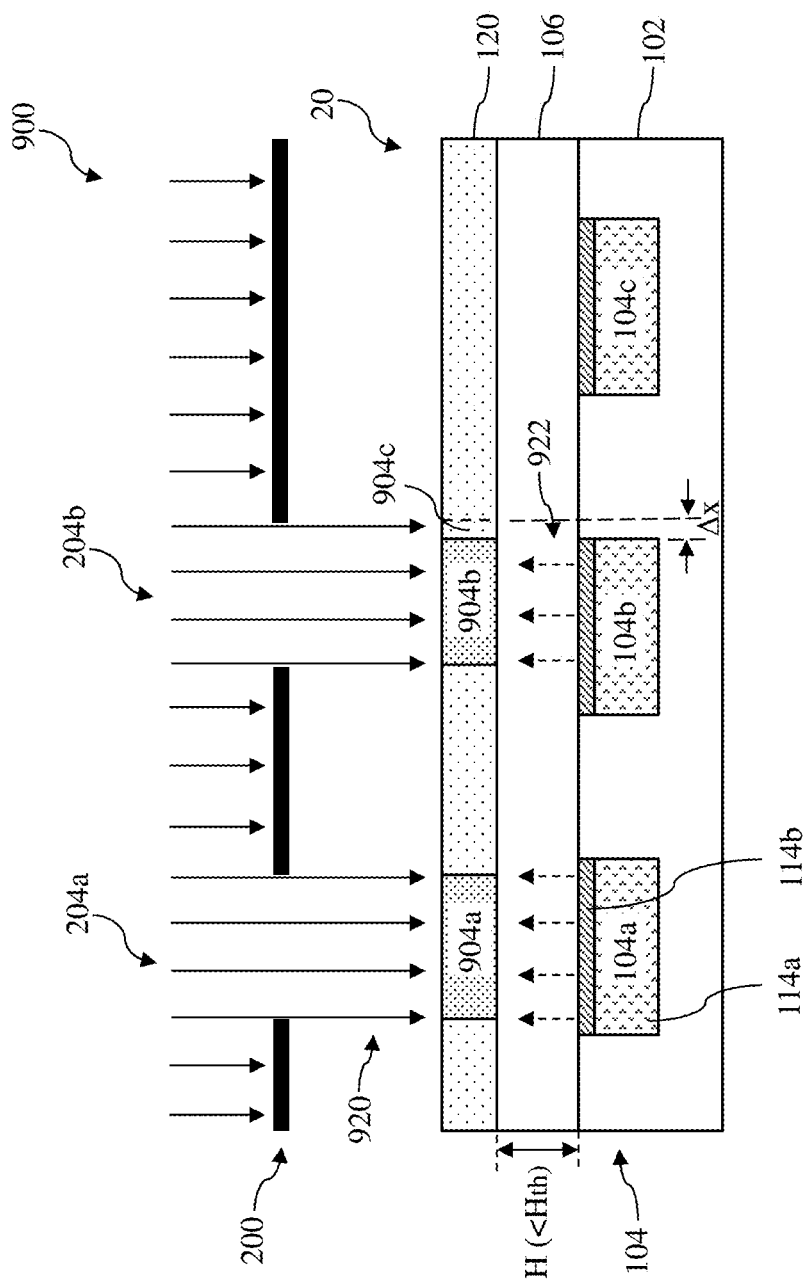

At operation 706, the method 700 (FIG. 7) performs a lithography exposure process 900 to form latent patterns in the photoresist layer 120, as shown in FIG. 10. The lithography exposure process 900 uses a photomask 200 having a first IC design pattern 204a and a second IC design pattern 204b (collectively as IC design patterns 204) to expose the photoresist layer 120 with a radiation 920, thereby forming latent patterns in the photoresist layer 120. The IC design patterns 204a and 204b are used for forming interconnect features (e.g., vias, contacts, or plugs) in the dielectric layer 106. In the illustrated embodiment, the IC design pattern 204a aligns with the underneath conductive feature 104a, while overlay errors occur in the IC design pattern 204b such that an edge of the IC design pattern 204b is offset from an edge of the underneath conductive feature 104b for a distance of Δx. The overlay errors may be due to misalignment between the photomask 200 and the semiconductor structure 20, inaccuracy in the geometry of the IC design pattern 204b during fabrication of the photomask 200, calibration inaccuracy occurred in the optical apparatus used in the lithography exposure process 900, or other reasons.

The exposing source used in the lithography exposure to generate radiation 920 may include any suitable source such as UV, DUV, EUV, or charged particles, such as E-beam. In some alternative embodiments, the IC design pattern is defined in a data file and is transferred to the photoresist layers by direct writing or other suitable technique, such as digital pattern generator. Other steps may be implemented before, during, or after the exposure process. In some embodiments, a post exposure baking process may be applied to the photoresist layer 120 after the lithography exposure process.

In the illustrated embodiment, the radiation 920 is configured such that the incident exposure dose directly from the radiation 920 to the photoresist layer 120 is less than the exposure threshold of the photoresist layer 120, thereby no latent pattern will be formed in the photoresist layer 120 by absorbing the incident exposure dose alone. A portion of the radiation 920 reaches the top surface of the conductive features 104a and 104b and is reflected as reflected radiation 922 back to the photoresist layer 120. The reflected exposure dose is mainly controlled by the reflectivity R of the top surface of the conductive feature 104 and the strength of the incident exposure dose. In some embodiments, the thickness H of the dielectric layer 106 is adjusted to control the reflected exposure dose. A sum of the incident exposure dose and the reflected exposure dose is configured to be larger than or at least equal to the exposure threshold of the photoresist layer 120. Therefore, latent patterns will be formed in portions of the photoresist layer 120 that receive both the incident exposure dose and the reflected exposure dose. The reflected radiation happens at portions of the top surface of the conductive features 104 where incident radiation 920 reaches. At other portions of the top surface of the conductive features 104 where incident radiation 920 does not reach or offset from the top surface of the conductive features 104, the strength of the reflected exposure dose decreases sharply. In other words, only portions of the photoresist layer 120, such as regions 904a and 904b that are directly under the respective IC patterns 204 in the photomask 200 and also directly above the conductive features 104, receive the sum of the incident exposure dose and the reflected exposure dose, which causes chemical changes to form latent patterns. Regarding the region 904c adjacent to the region 904b, which is offset from an edge of the conductive feature 104b, it receives substantially only the incident radiation 920 but no reflected radiation 922, which is not strong enough to expose the region 904c. Therefore, the latent pattern formed in the region 904b does not extend into the region 904c. Accordingly, the latent pattern formed in the region 904b is self-aligned with the underneath conducive feature 104b.

Figure 11:
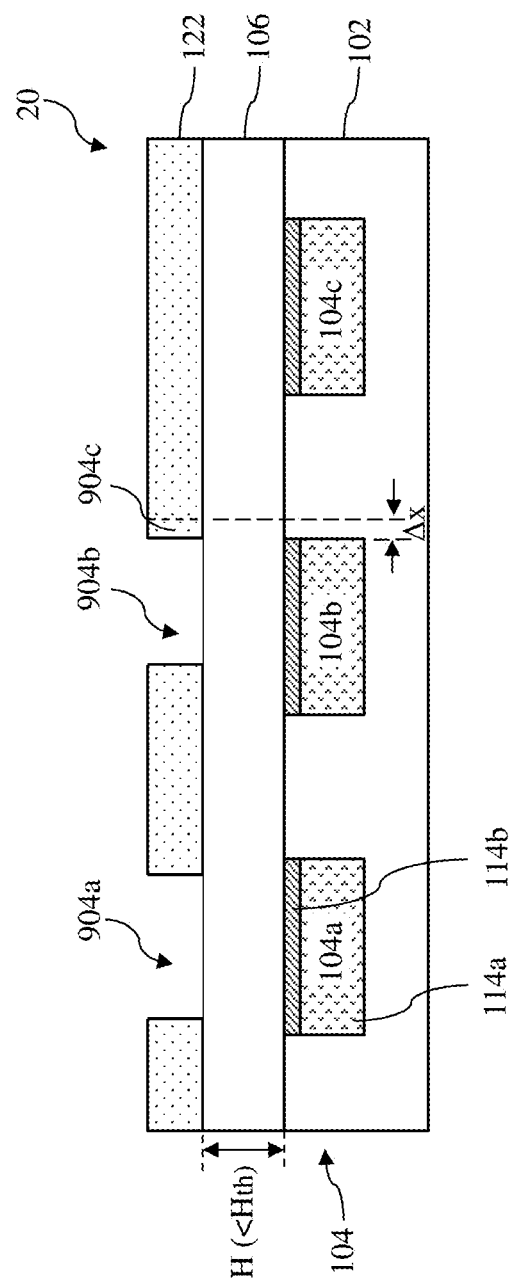

At operation 708, the method 700 (FIG. 7) develops the photoresist layer 120 to form a patterned photoresist layer 122, as shown in FIG. 11. In the illustrated embodiment, the photoresist layer 120 is positive, so the portions of the photoresist layer 120 associated with the latent patterns in the regions 904a and 904b are removed by the corresponding developer to form openings in regions 904a and 904b. The region 904c, which is offset from the conductive feature 104b, does not receive exposure doses higher than the exposure threshold and remains undeveloped.

Figure 12:
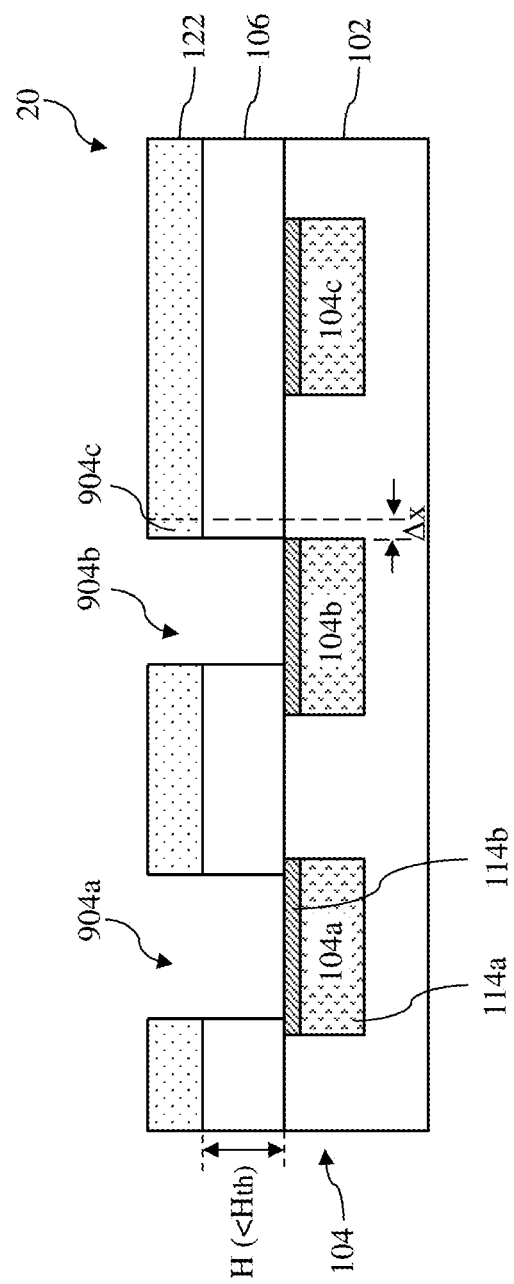
Figure 13:
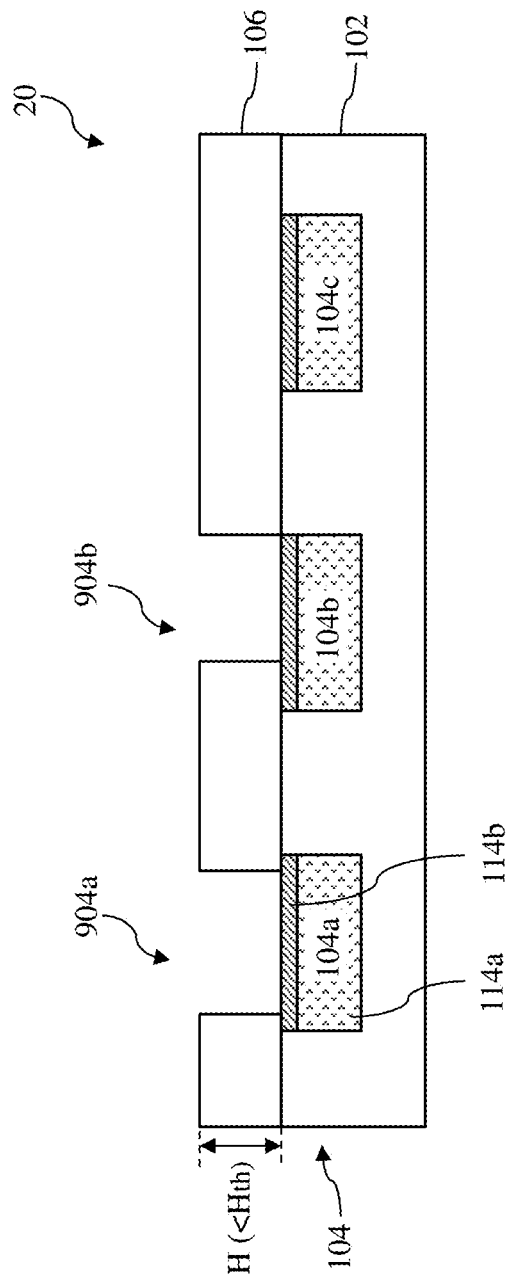

At operation 710, the method 700 (FIG. 7) etches the dielectric layer 106 by using the patterned photoresist layer 122 as an etch mask, thereby transferring a pattern in the patterned photoresist layer 122 to the dielectric layer 106, as shown in FIG. 12. Operation 710 may include one or more etching processes to remove different portions of the dielectric layer 106, such as a hard mask layer, a low-k dielectric layer, and an etch stop layer to extend the openings in the regions 904a and 904b downwardly to the top surface of the conductive features 104a and 104b. In some embodiments, the conductive features 104 are metal lines and the openings in the regions 904a and 904b are referred to as via trenches. The top surface of the conductive features 104a and 104b are exposed in the respective via trenches. The etching process may include any suitable etching technique, such as dry etching, wet etching, or a combination thereof. Other operations may be subsequently implemented. For example, the patterned photoresist layer 122 may be removed by wet stripping or plasma ashing process, as shown in FIG. 13. The plasma ashing process may include using oxygen ($O_2$) plasma or carbon dioxide ($CO_2$) plasma.

Figure 14:
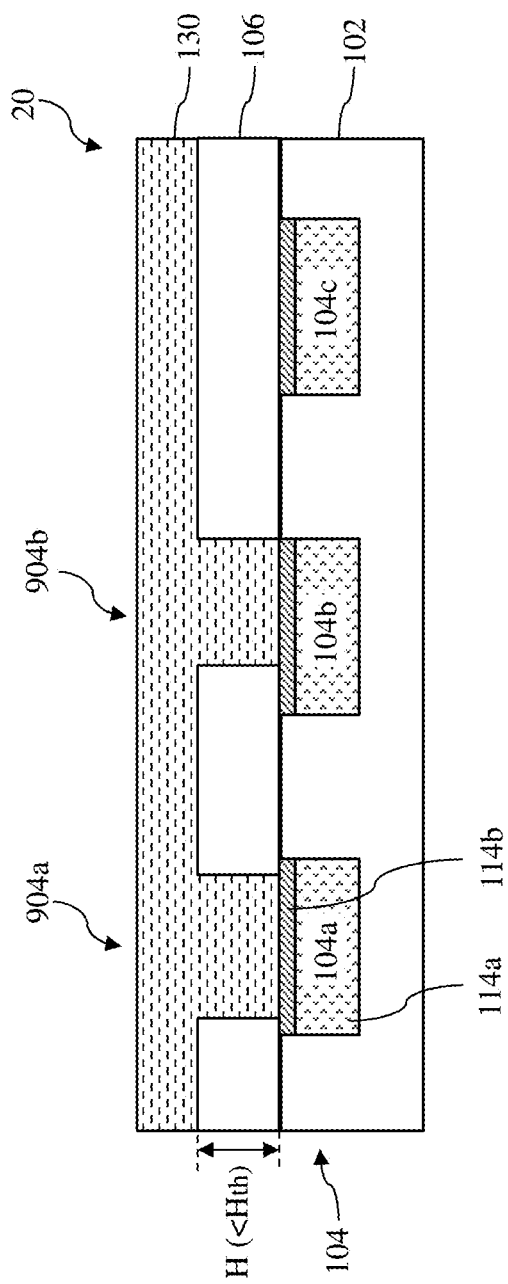

In some embodiments, the conductive features 104 are formed of continuous metallic material or the reflective layer 114b is conductive, the method 700 (FIG. 7) may optionally proceed from operation 710 to operation 714 by depositing a metal layer 130 to fill the via trenches in regions 904a and 904b and covers the dielectric layer 106, as shown in FIG. 14. The metal layer 130 is in direct contact with the top surfaces of the conductive features 104a and 104b. In some embodiments, the metal layer 130 includes Cu, Al, W, or other suitable conductive material. In some embodiments, the metal layer 130 includes Cu alloy, such as copper magnesium (CuMn), copper aluminum (CuAl) or copper silicon (CuSi). In some embodiments, the metal layer 130 is deposited by PVD. In some examples, the metal layer 130 is formed by depositing a corresponding metal seed layer using PVD, and then forming a bulk metal layer by plating.

Figure 15:
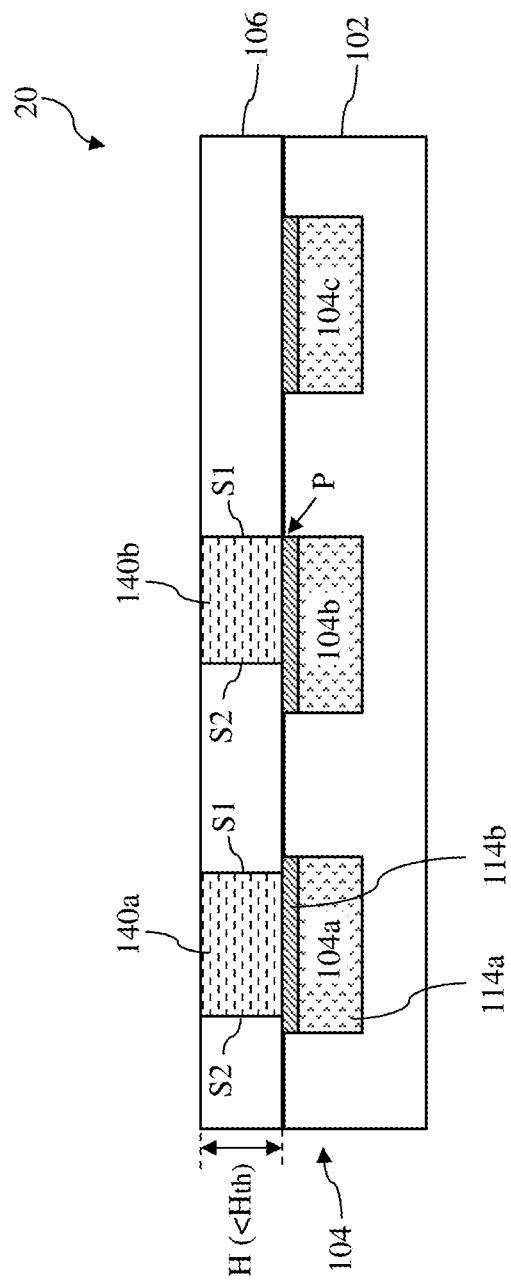

At operation 716, the method 700 (FIG. 7) performs a chemical mechanical polishing (CMP) process to remove the excessive metal layer 130, thereby forming interconnect features 140a and 140b, such as vias 140a and 140b, as shown in FIG. 15. The CMP process may also remove a top portion of the dielectric layer 106, such as a hard mask layer. A substantially coplanar top surface of the interconnect features 140a and 140b and the dielectric layer 106 may be formed after the CMP process. Due to the self-aligned lithography exposure process, both sidewalls S1 and S2 of the interconnect features 140a and 140b are landing on the top surfaces of the respective conductive features 104a and 104b. The sidewall Si of the interconnect feature 140b has a landing point P that is substantially at the edge of the conductive feature 104b, such as within a lateral distance to the edge of the conductive feature 104b at about 20% of the interconnect feature CD size. For example, for a via feature's diameter with a CD (critical dimension) of 20 nm, the landing point P is about within 4 nm (20 nm×20%=4 nm) lateral distance to the edge of the conductive feature 104b. Accordingly, the sidewall S1 of the interconnect features 140b is also referred to be substantially aligned with an edge of the conductive feature 104b.

Figure 16:
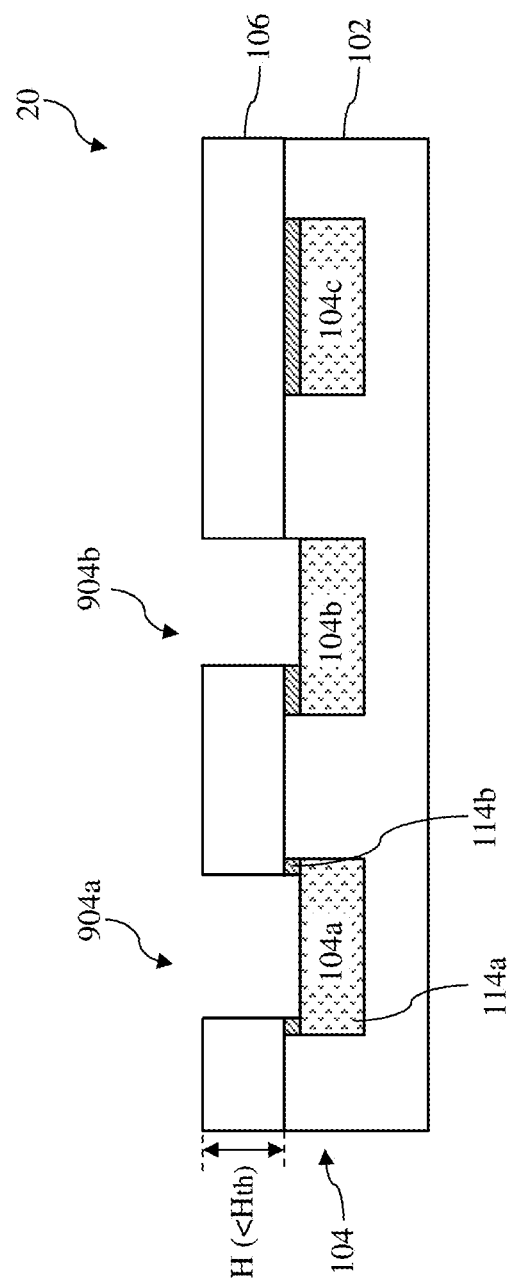

In some embodiments, the reflective layers 114b of the conductive features 104 are formed of high-resist material, non-conductive material, or reflective multilayers, and the method 700 (FIG. 7) may optionally proceed from operation 710 to operation 712 by selectively etching the reflective layers 114b to expose the underneath high-conductive bulk metal layer 114a in the openings, as shown in FIG. 16. Operation 712 includes a selective etching process to remove portions of the reflective layers 114b exposed in the via trenches. The etch process and the etchant are properly chosen for selective etch without damage to the dielectric layer 106. The etching process may include any suitable etching technique, such as dry etching, wet etching, or a combination thereof. The etching process stops at the bulk metal layer 114a. In the illustrated embodiment, after operation 712, portions of the reflective layer 114b remain on both ends of the conductive feature 104a, while portions of the reflective layer 114b remain on only one end of the conductive feature 104b.

Figure 17:
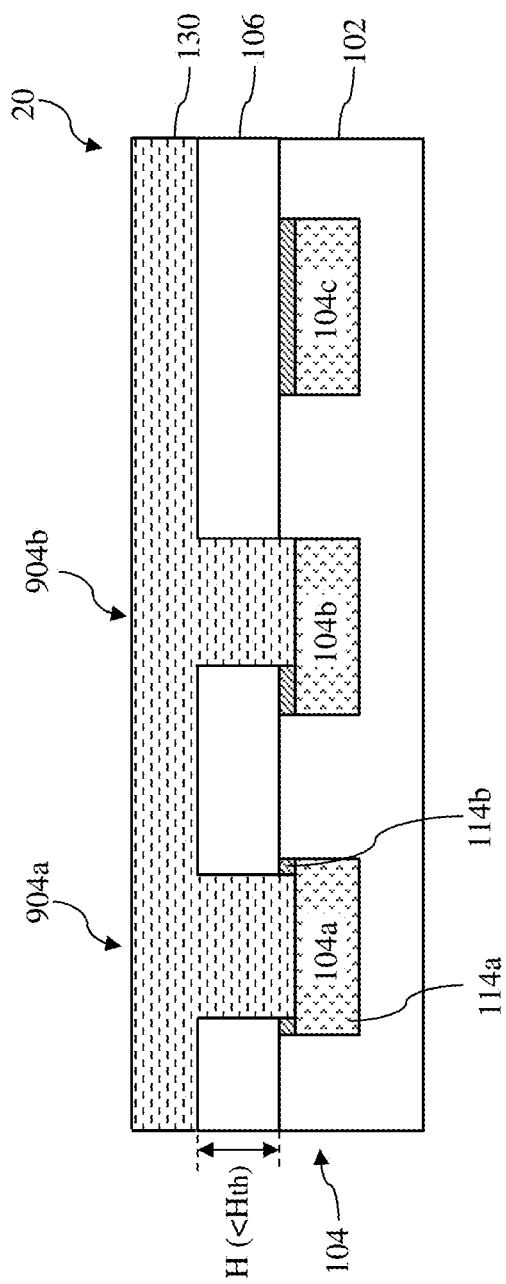
Figure 18:
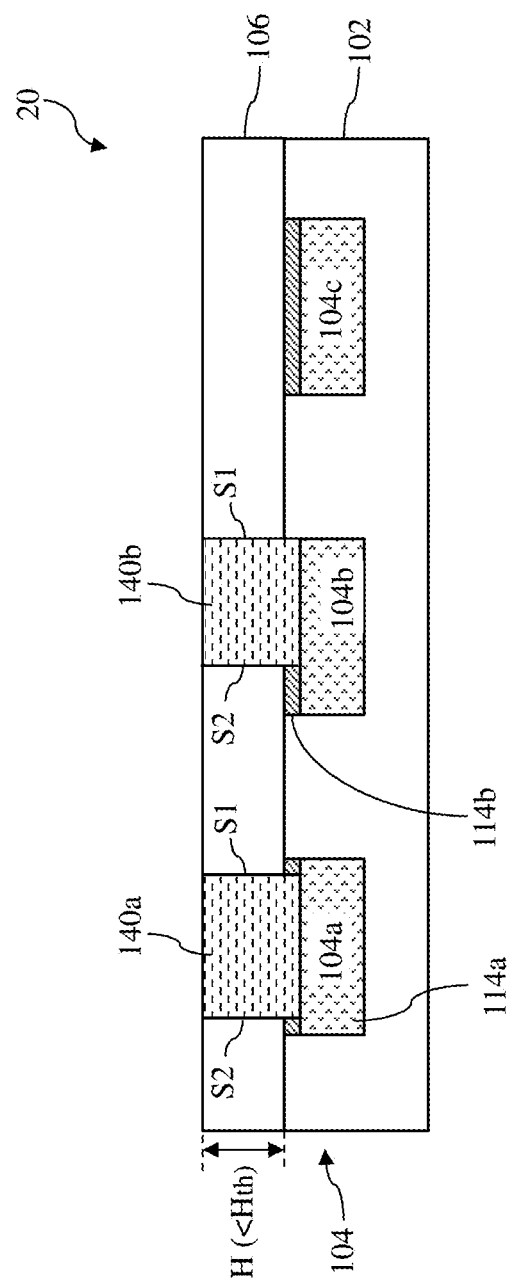

Referring to FIGS. 17 and 18, the method 700 (FIG. 7) then proceeds to operations 714 and 716 to deposit a metal layer 130 to fill the via trenches in regions 904a and 904b and perform a CMP process to remove the excessive metal layer 130, thereby forming interconnect features 140a and 140b. Due to the self-aligned lithography exposure process, both sidewalls S1 and S2 of the interconnect features 140a and 140b are landing on the top surfaces of the respective conductive features 104a and 104b. The sidewall S1 of the interconnect features 140b may substantially align with an edge of the conductive feature 104b. Bottom portions of the sidewalls S1 and S2 of the interconnect features 140a are covered by the reflective layer 114b. Bottom portion of the sidewall S2 of the interconnect feature 140b is covered by the reflective layer 114b. Bottom portion of the sidewall S1 of the interconnect feature 140b is covered by a top portion of the substrate 102. Upper portions of the sidewalls S1 and S2 of the interconnect features 140a and 140b are covered by the dielectric layer 106.

Figure 19A:
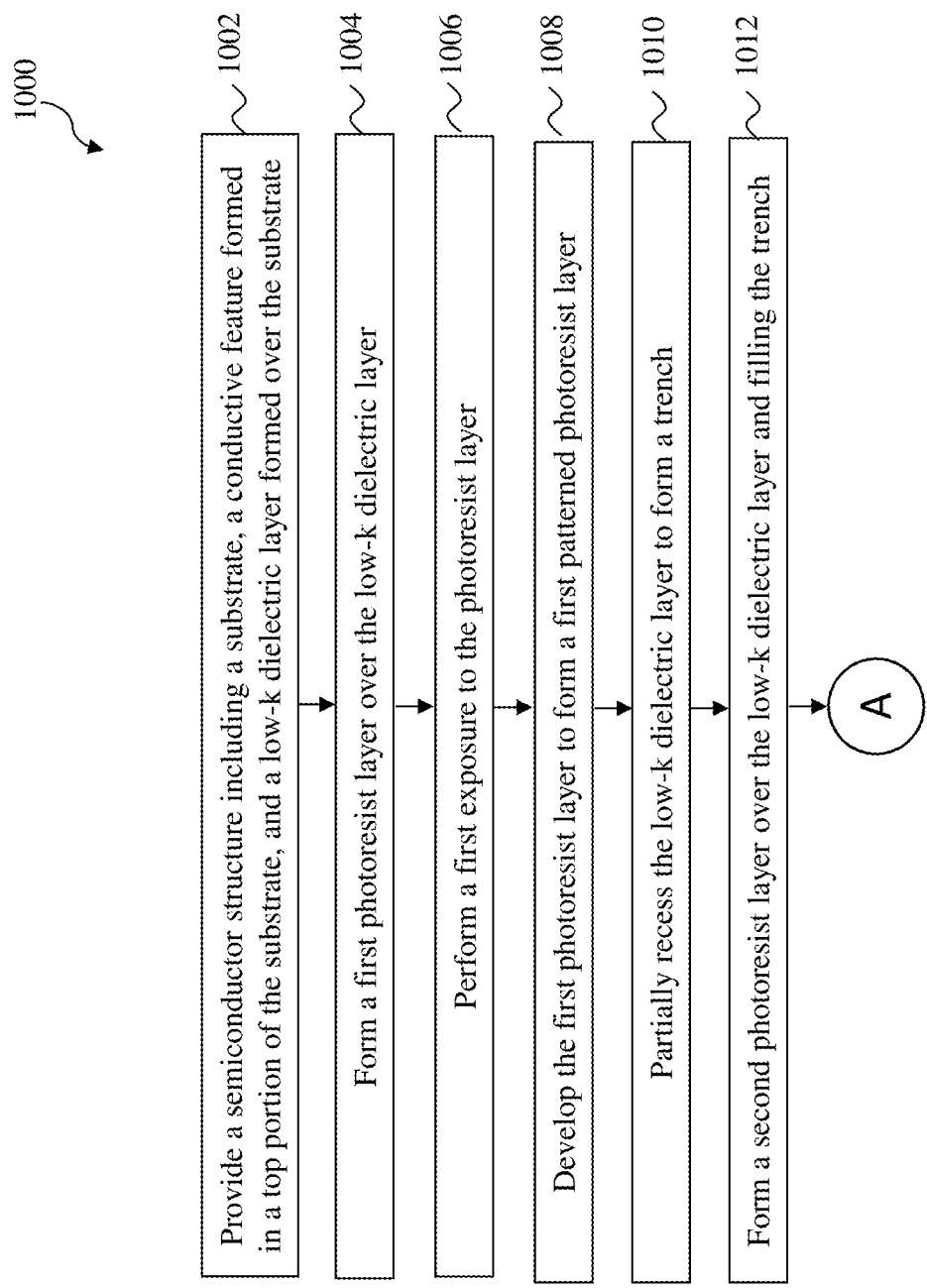
FIGS. 19A and 19B illustrate a flowchart of another method for making a semiconductor structure with self-aligned interconnect structures according to some embodiments of the present disclosure.
Figure 19B:
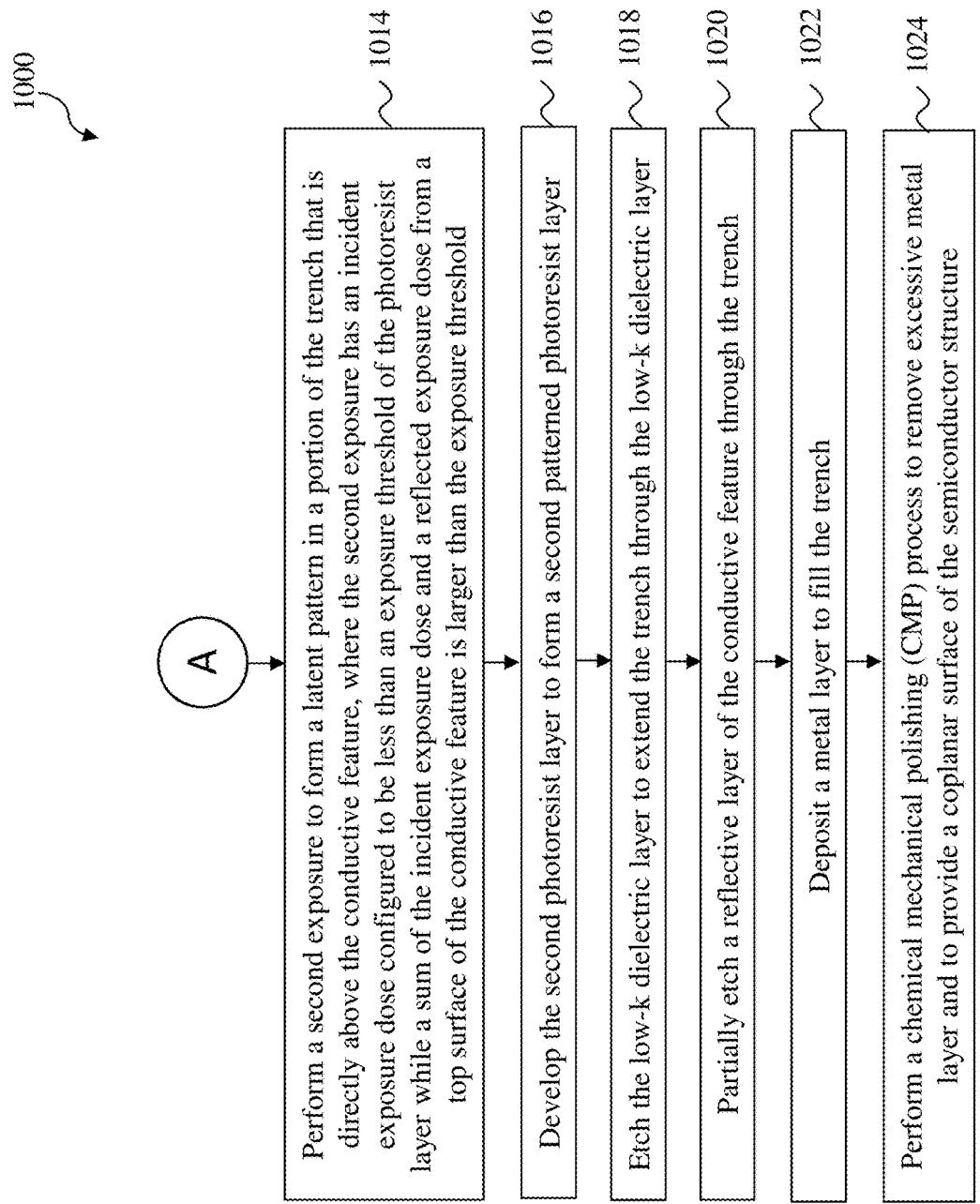

FIGS. 19A and 19B show a flowchart of a method 1000 for making a semiconductor structure using a self-aligned lithography exposure process according to one or more alternative embodiments of the present disclosure. The method 1000 is merely an example, and is not intended to limit the present disclosure beyond what is explicitly recited in the claims. Additional steps can be provided before, during, and after method 1000, and some of the steps described can be moved, replaced, or eliminated for additional embodiments of method 1000. FIGS. 19A and 19B will be described below in conjunction with FIGS. 20-35, which are cross sectional views of a semiconductor structure 30 at various fabrication stages according to method 1000.

Figure 20:
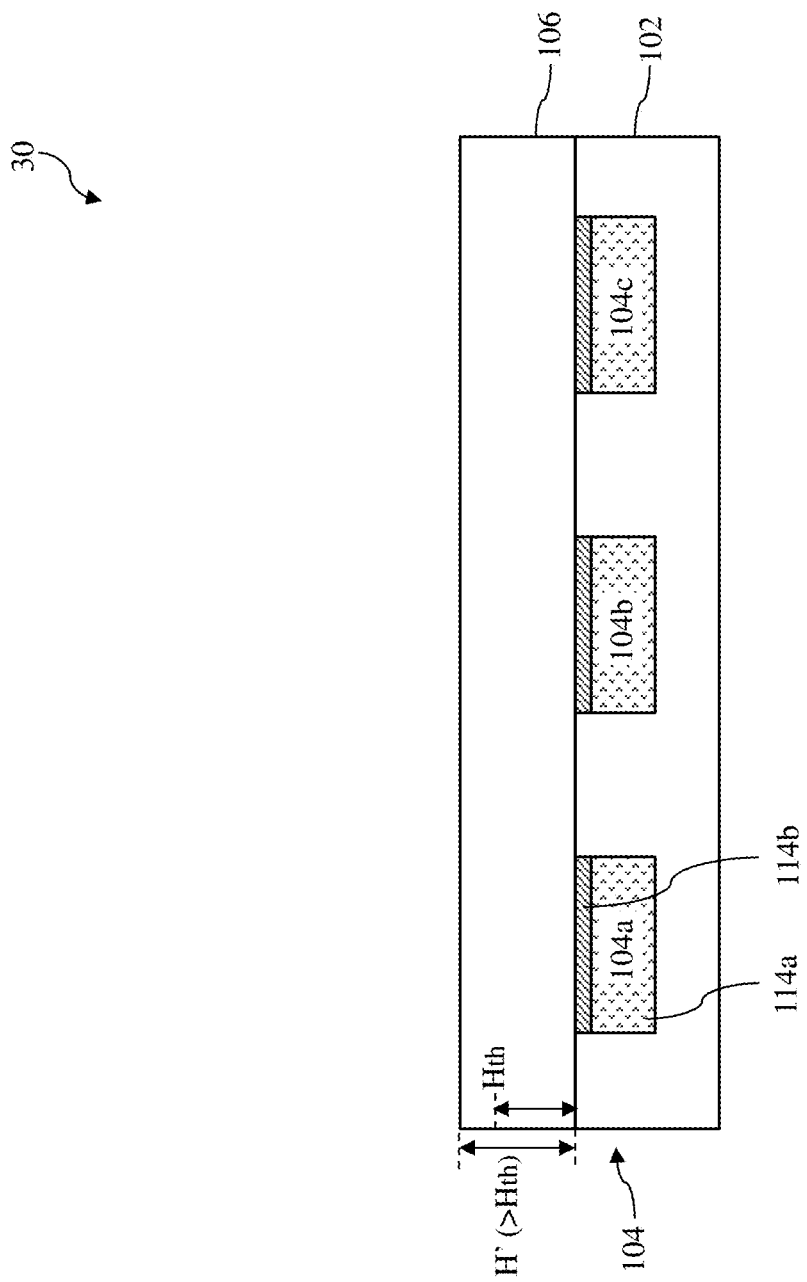
FIGS. 20, 21, 22, 23, 24, 25, 26, 27, 28, 29, 30, 31, 32, 33, 34, and 35 are cross-sectional views of a semiconductor structure using double lithography patterning processes according to some embodiments of the present disclosure.

At operation 1002, the method 1000 (FIG. 19A) provides the semiconductor structure 30, as shown in FIG. 20. The semiconductor structure 30 includes a semiconductor substrate 102, a plurality of conductive features 104a-c (collectively as conductive features 104) formed in a top portion of the semiconductor substrate 102, and a dielectric layer 106 over the semiconductor substrate 102. As will be discussed below, in the illustrated embodiment, interconnect features (e.g., vias, contacts, or plugs) will be formed to contact and electrically couple with the conductive features 104a and 104b, but not on the conductive feature 104c. The conductive feature 104c may be part of an intra-layer routing or have interconnect features elsewhere. The various compositions and material layers of the semiconductor structure 30 are similar to what have been discussed above with reference to the semiconductor structure 20 in FIG. 8 and the semiconductor structure 10 in FIG. 1 and will be briefly discussed below for the sake of convenience. Reference numerals are repeated for ease of understanding. Some differences will be emphasized.

In various embodiments, the dielectric layer 106 has a thickness H' that is larger than a threshold distance $H_{th}$ in a subsequent lithography exposure process. For a lithography exposure process using a DUV radiation, the threshold distance $H_{th}$ may range from about 5 nm to about 20 nm, such as about 10 nm. In an example that $H_{th}$ is about 10 nm, H' may range from about 15 nm to about 50 nm, such as about 20 nm. For a lithography exposure process using an EUV radiation, the threshold distance $H_{th}$ may range from about 1 nm to about 10 nm, such as about 5 nm. In an example that $H_{th}$ is about 5 nm, H' may range from about 10 nm to about 50 nm, such as about 15 nm. As discussed above in association with FIGS. 4-6, when the distance between a photoresist layer and underneath conductive feature is larger than the threshold distance $H_{th}$, the exposure contrast may be poor and further affect critical dimensions (CD) of latent patterns to-be-formed in the photoresist layer. As will be discussed below, the method 1000 uses a first lithography exposure process to partially recess the dielectric layer 106 to a thickness below the threshold distance $H_{th}$, then applies a second lithography exposure process to form self-aligned interconnect features.

Figure 21:
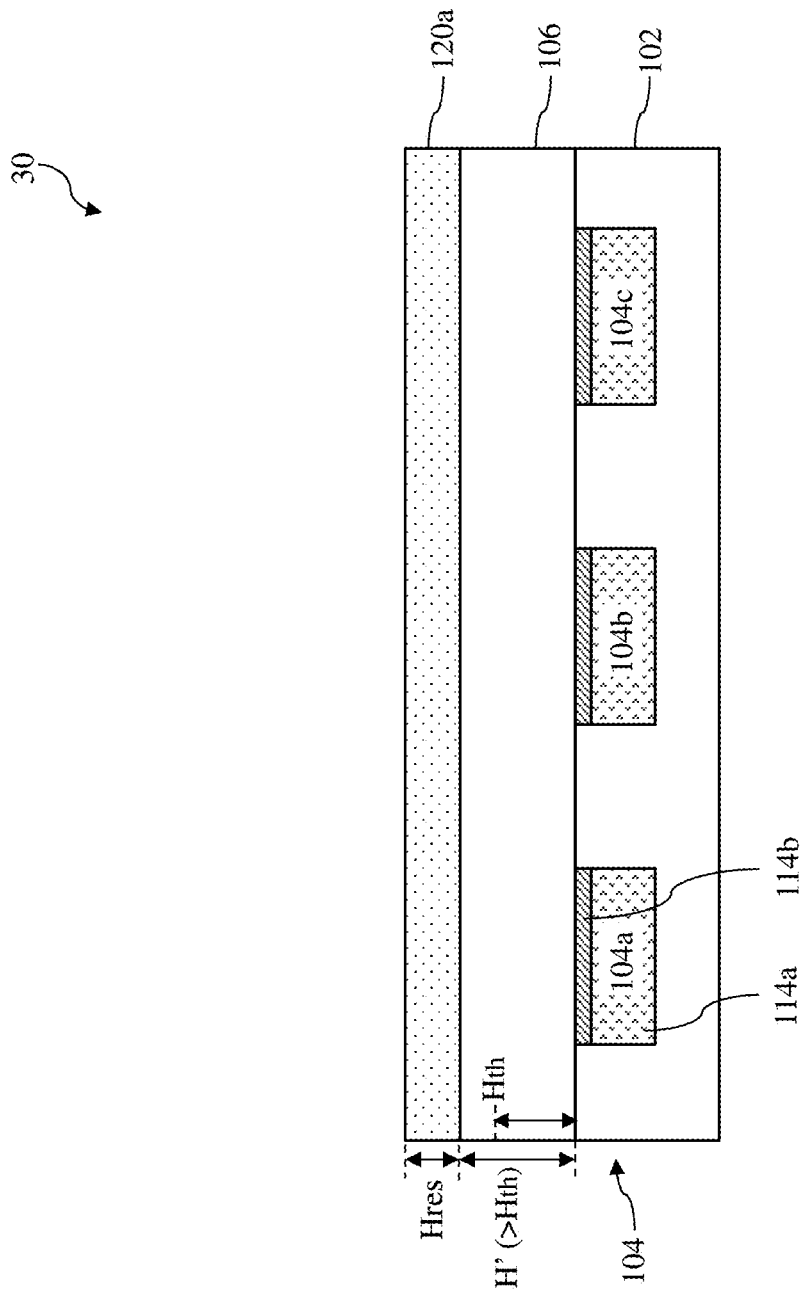

At operation 1004, the method 1000 (FIG. 19A) forms a first photoresist layer 120a over the dielectric layer 106, as shown in FIG. 21. Forming of the photoresist layer 120a includes coating the photoresist solution on the dielectric layer 106 by a suitable technique, such as spin-on coating. Other manufacturing steps, such as soft baking may be further applied to the first photoresist layer 120a. The first photoresist layer 120a may include a positive photoresist material that may become dissolvable to the developer solution after exposing to the radiation source. In some alternative embodiments, the photoresist layer 120a may include a negative photoresist material that becomes indissolvable to the developer solution after exposing to the radiation source. The first photoresist layer 120a has a predetermined exposure threshold T1. The first photoresist layer 120a may have a thickness $H_{res}$ in a range from about 200 Å to about 800 Å.

Figure 22:
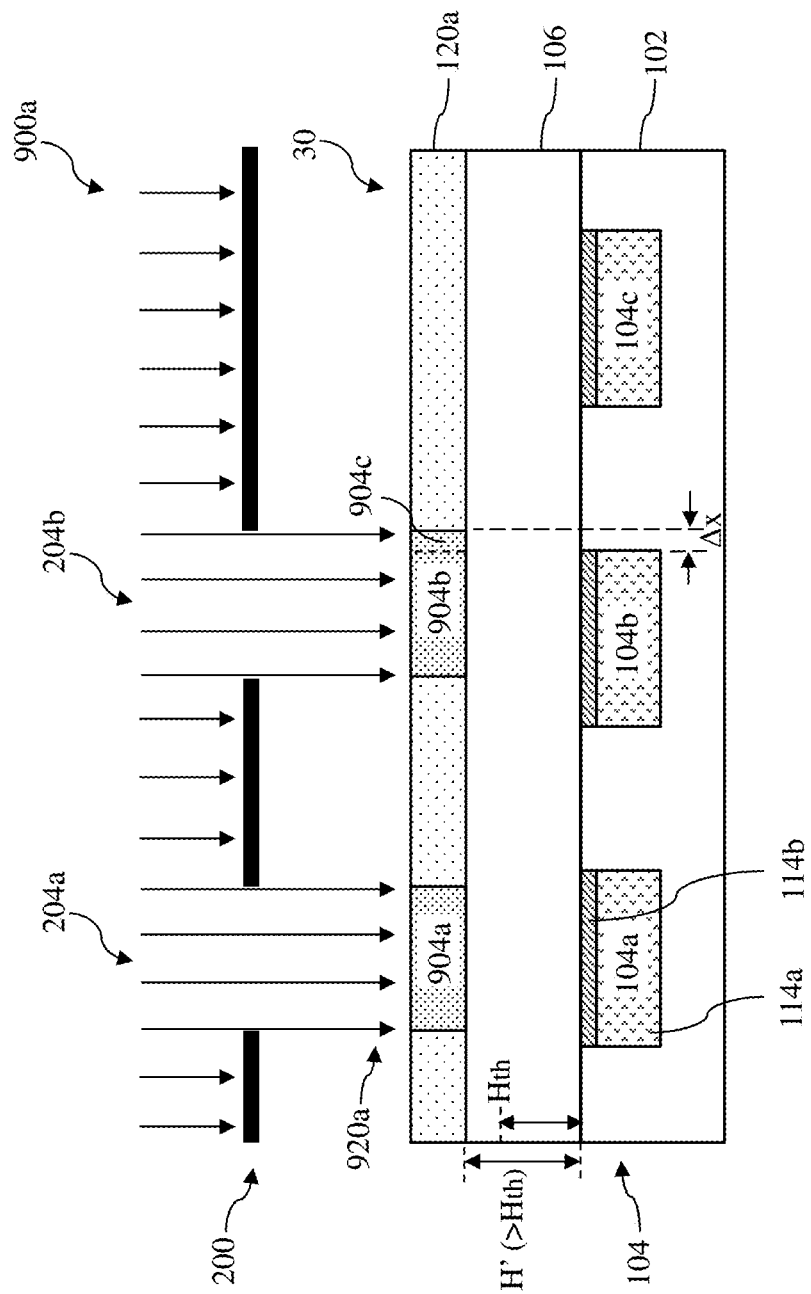

At operation 1006, the method 1000 (FIG. 19A) performs a first lithography exposure process 900a to from latent patterns in the photoresist layer 120a, as shown in FIG. 22.

The lithography exposure process 900a uses a photomask 200 having a first IC design pattern 204a and a second IC design pattern 204b (collectively as IC design patterns 204) to expose the photoresist layer 120a in a radiation 920a, thereby forming latent patterns in the photoresist layer 120. The IC design patterns 204a and 204b are used for forming interconnect features (e.g., vias, contacts, or plugs) in the dielectric layer 106. In the illustrated embodiment, the IC design pattern 204a aligns with the underneath conductive feature 104a, while overlay errors occur in the IC design pattern 204b such that an edge of the IC design pattern 204b is offset from an edge of the underneath conductive feature 104b for a distance of Δx. The overlay errors may be due to misalignment between the photomask 200 and the semiconductor structure 30, inaccuracy in the geometry of the IC design pattern 204b during fabrication of the photomask 200, calibration inaccuracy occurred in the optical apparatus used in the lithography exposure process 900a, or other reasons.

The exposing source used in the lithography exposure to generate radiation 920a may include any suitable source such as UV, DUV, EUV, or charged particles, such as E-beam. In some alternative embodiments, the IC design pattern is defined in a data file and is transferred to the photoresist layers by direct writing or other suitable technique, such as digital pattern generator. Other steps may be implemented before, during, or after the exposure process. In some embodiments, a post exposure baking process may be applied to the photoresist layer 120a after the lithography exposure process.

The radiation 920a is configured such that the incident exposure dose directly from the radiation 920a to the photoresist layer 120 is larger than the exposure threshold T1 of the photoresist layer 120a. Accordingly, portions of the photoresist layer 120 directly under the IC design patterns 204a and 204b receive an incident exposure dose larger than the exposure threshold T1, which causes chemical changes in forming latent patterns. The latent patterns are formed in the regions 904a and 904b, as well as in the adjacent region 904c that is offset from the underneath conductive feature 104b.

Figure 23:
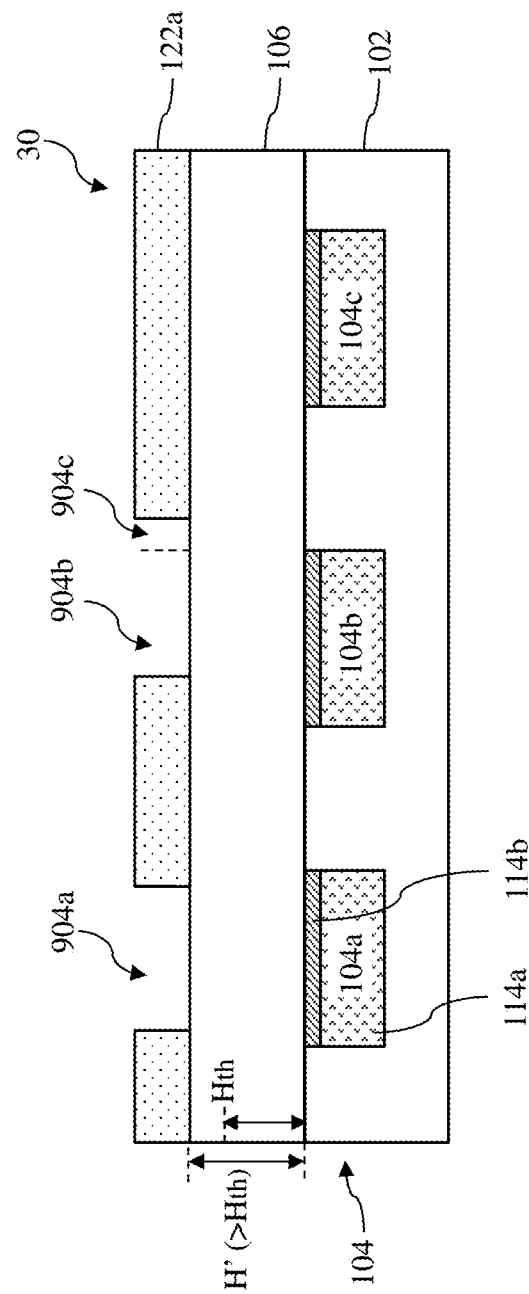

At operation 1008, the method 1000 (FIG. 19A) develops the photoresist layer 120a to form a patterned photoresist layer 122a, as shown in FIG. 23. In the illustrated embodiment, the photoresist layer 120a is positive, so the portions of the photoresist layer 120a associated with the latent patterns in regions 904a, 904b, and 904c are removed by the corresponding developer to form openings. Since the photoresist layer 120a in the region 904c receives incident exposure dose higher than the exposure threshold T1, it is also developed even though it is offset from the conductive feature 104b.

Figure 24:
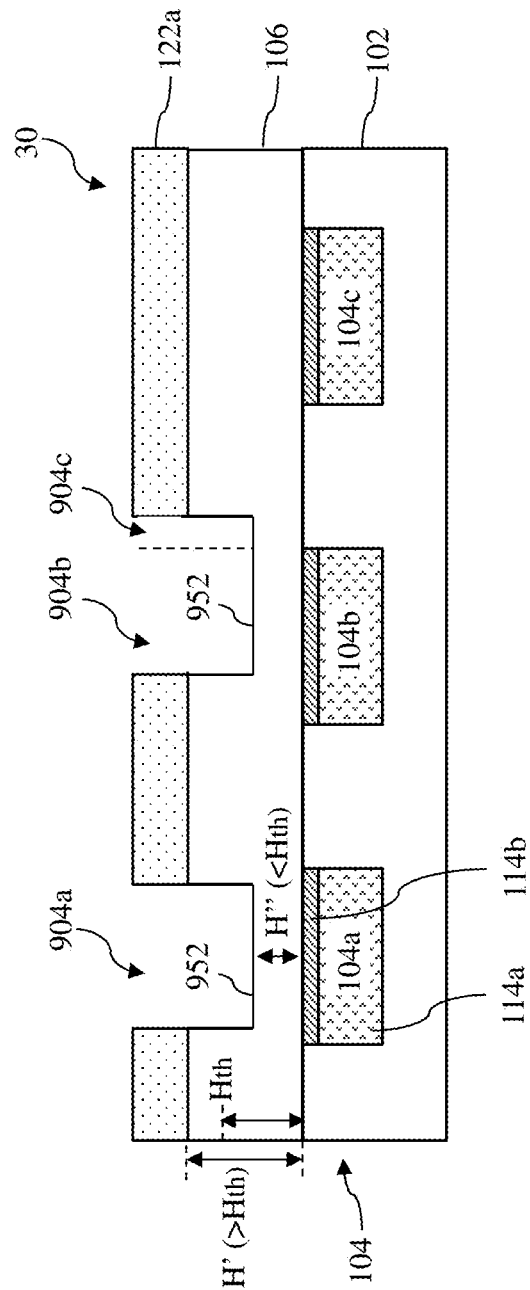
Figure 25:
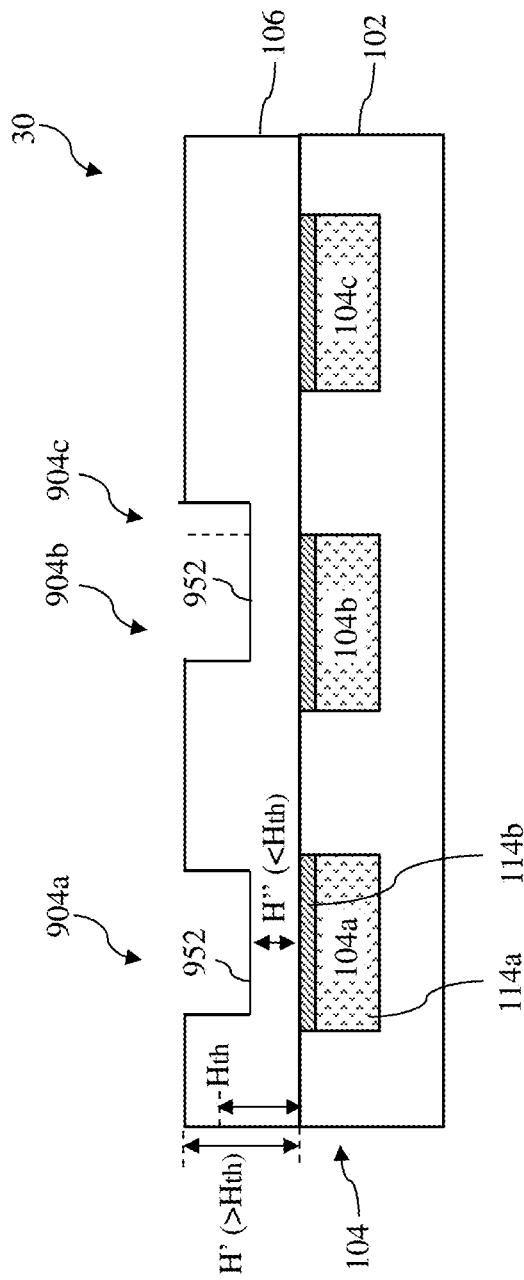

At operation 1010, the method 1000 (FIG. 19A) partially recesses the dielectric layer 106 in an etching process, as shown in FIG. 24. The etching process uses the patterned photoresist layer 122a as an etch mask. Operation 1010 may include one or more etching processes to remove different portions of the dielectric layer 106, such as a hard mask layer, a low-k dielectric layer, and an etch stop layer (as shown in FIG. 1) to form via trenches and extend the via trench in the region 904a and the via trench in the regions 904b and 904c downwardly towards the conductive features 104a and 104b, respectively. In some embodiments, suitable etching process, such as a plasma dry etching using $CH_xF_y$, $CF_x$, $Cl_2$ or $BCl_3$-based chemistries, is used. After operation 1010, a distance between bottom surfaces 952 of the via trenches and the top surfaces of the conductive features 104, denoted as H", is less than the threshold distance $H_{th}$ (H"<$H_{th}$). In one embodiment, the etching process uses time mode to control the etching depth (H'-H"), such that the low-k dielectric layer (not shown) of the dielectric layer 106 is partially etched but not through, and the bottom surfaces 952 of the via trenches stop inside the low-k dielectric layer. In another embodiment, the etching process etches through the low-k dielectric layer and stops at the etch stop layer (not shown) of the dielectric layer 106, such that the distance H" is defined by the thickness of the etch stop layer. Other operations may be subsequently implemented. For example, the patterned photoresist layer 122a may be removed by wet stripping or plasma ashing process, as shown in FIG. 25. The plasma ashing process may include using oxygen ($O_2$) plasma or carbon dioxide ($CO_2$) plasma.

Figure 26:
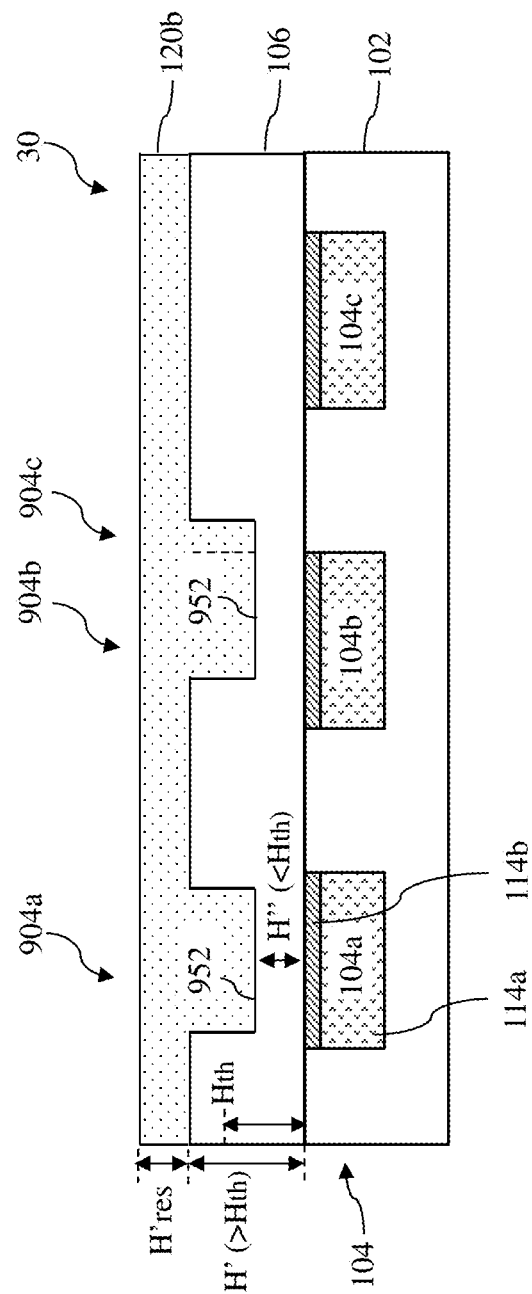

At operation 1012, the method 1000 (FIG. 19A) forms a second photoresist layer 120b over the dielectric layer 106 and fills the via trenches in the regions 904a-c, as shown in FIG. 26. Forming of the second photoresist layer 120b may be substantially similar to that of the first photoresist layer 120a as discussed with respect to operation 1004. In some embodiments, forming of the second photoresist layer 120b includes coating the photoresist solution on the dielectric layer 106 by a suitable technique, such as spin-on coating. Other manufacturing steps, such as soft baking may be further applied to the second photoresist layer 120b. In some embodiments, the second photoresist layer 120b includes the same composition as the first photoresist layer 120a. In some embodiments, the second photoresist layer 120b includes different composition from the first photoresist layer 120a. The composition of the second photoresist layer 120b may be adjusted, for example, by changing the ratio of carbon, hydrogen and oxygen, to have a different exposure threshold for the second lithography exposure process as will be discussed later in the present disclosure. The composition of the second photoresist layer 120b may also be adjusted to be sensitive to radiation wavelengths different from the first photoresist layer 120a. The second photoresist layer 120b has a predetermined exposure threshold T2. The second photoresist layer 120a may have a thickness $H'_{res}$ in a range from about 200 Å to about 800 Å.

Figure 27:
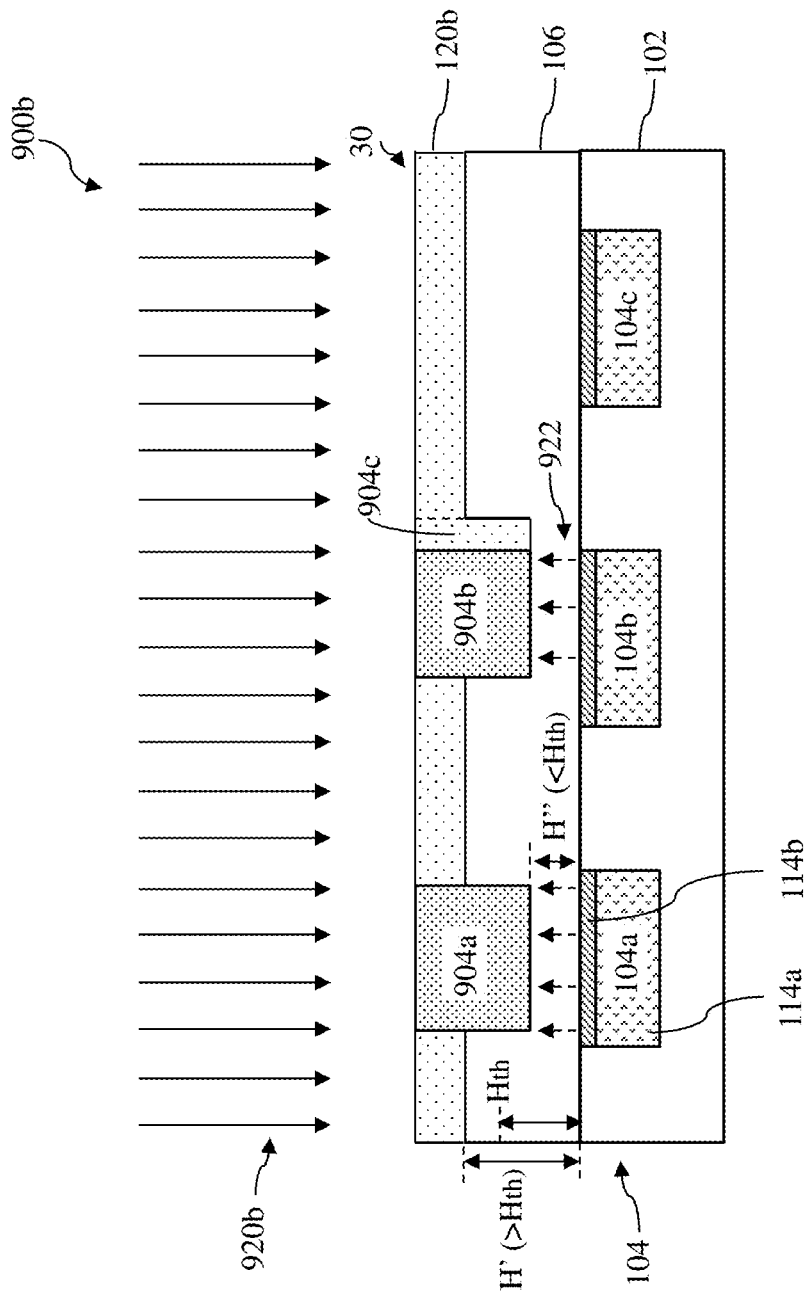

At operation 1014, the method 1000 (FIG. 19B) performs a second lithography exposure process 900b to form latent patterns in the photoresist layer 120b, as shown in FIG. 27. In some embodiments, the second lithography exposure process 900b uses the same mask as the first lithography exposure 900a, such as the mask 200 as discussed with respect to operation 1006. In the illustrated embodiment, the second lithography exposure process 900b is a blanket lithography exposure process. In other words, the second lithography exposure process 900b does not use a mask, which exposes the whole semiconductor structure 30. A blanket lithography exposure process contributes to the reduction of overall cost of manufacturing, such as reducing the cost of masks and the processing time. The exposing source used in the second lithography exposure to generate radiation 920b may include any suitable source such as UV, DUV, EUV, or charged particles, such as E-beam. In some alternative embodiments, the IC design pattern is defined in a data file and is transferred to the photoresist layers by direct writing or other suitable technique, such as digital pattern generator. The first and second lithography exposure processes 900a and 900b may use the same radiation source. Alternatively, the first and second lithography exposure processes 900a and 900b may use different radiation sources, such as under different radiation wavelengths. In one example, the first lithography exposure process 900a uses a 248 nm DUV radiation, and the second lithography exposure process 900b uses a 193 nm DUV radiation. In another example, the first lithography exposure process 900a uses a DUV radiation, and the second lithography exposure process 900b uses an EUV radiation. Other steps may be implemented before, during, or after the exposure process. In some embodiments, a post exposure baking process may be applied to the photoresist layer 120b after the second lithography exposure process 900b.

In the illustrated embodiment, the radiation 920b is configured such that the incident exposure dose directly from the radiation 920b to the photoresist layer 120b is less than the exposure threshold T2 of the photoresist layer 120b, thereby no latent pattern will be formed in the photoresist layer 120b by absorbing the incident exposure dose alone. A portion of the radiation 920b reaches the top surface of the conductive features 104a and 104b and is reflected as reflected radiation 922 back to the photoresist layer 120b. The reflected exposure dose is mainly controlled by the reflectivity R of the top surface of the conductive feature 104 and the strength of the incident exposure dose. In some embodiments, the thickness H" of the dielectric layer 106 under the via trenches is adjusted to control the reflected exposure dose. A sum of the incident exposure dose and the reflected exposure dose is configured to be larger than or at least equivalent to the exposure threshold T2 of the photoresist layer 120b. Therefore, latent patterns will be formed in portions of the photoresist layer 120b that receive both the incident exposure dose and the reflected exposure dose. The reflected radiation happens at portions of the top surface of the conductive features 104 where incident radiation 920b reaches. At other portions of the top surface of the conductive features 104 where incident radiation 920b does not reach or offset from the top surface of the conductive features 104, the strength of the reflected exposure dose decreases sharply. By partially recessing the dielectric layer 106 as discussed with respect to operation 1010 to reduce a distance between the photoresist layer 120b and the conductive features 104 to be below the threshold distance $H_{th}$ (H"<$H_{th}$), the exposure contrast is increased. In other words, only portions of the photoresist layer 120b, such as regions 904a and 904b that are directly above the conductive features 104, receive the sum of the incident exposure dose and the reflected exposure dose, which causes chemical changes to form latent patterns. Regarding the region 904c adjacent to the region 904b, which is offset from an edge of the conductive feature 104b, it receives substantially only the incident radiation 920b but no reflected radiation 922, which is not strong enough to expose the region 904c. Therefore, the latent pattern formed in the region 904b does not extend into the region 904c. Accordingly, the latent pattern formed in the region 904b is self-aligned with the underneath conducive feature 104b.

Figure 28:
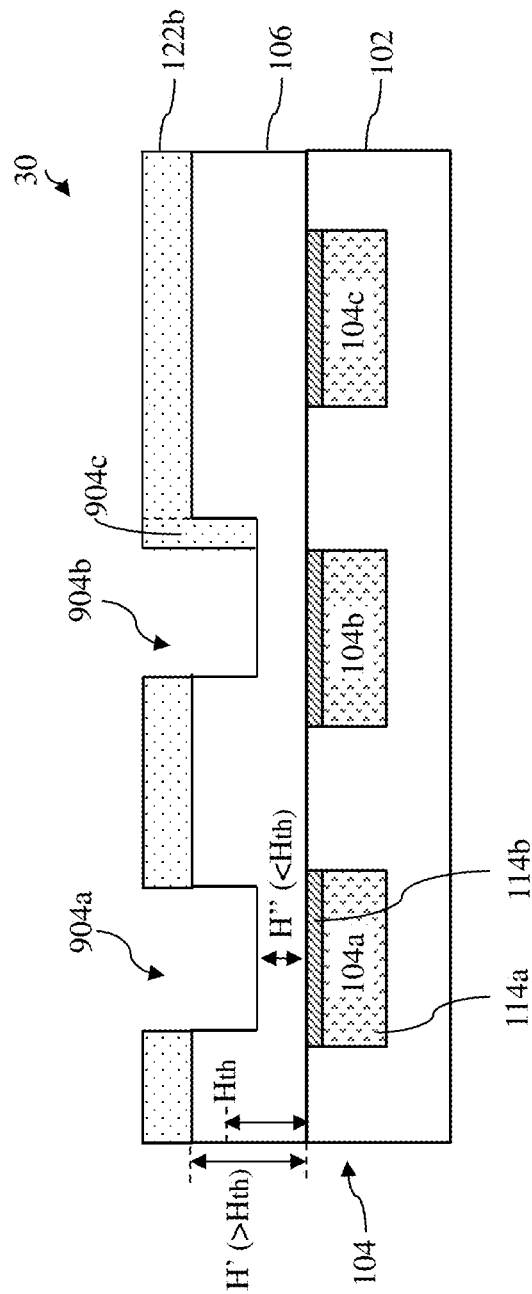

At operation 1016, the method 1000 (FIG. 19B) develops the photoresist layer 120b to form a patterned photoresist layer 122b, as shown in FIG. 28. In the illustrated embodiment, the photoresist layer 120 is positive, so the portions of the photoresist layer 122b associated with the latent patterns in the regions 904a and 904b are removed by the corresponding developer to expose via trenches in the regions 904a and 904b. The photoresist layer 120 in the region 904c, which is offset from the conductive feature 104b, does not receive exposure doses higher than the exposure threshold and remains undeveloped. In other words, the via trench above the conductive feature 104b is partially filled with the photoresist.

Figure 29:
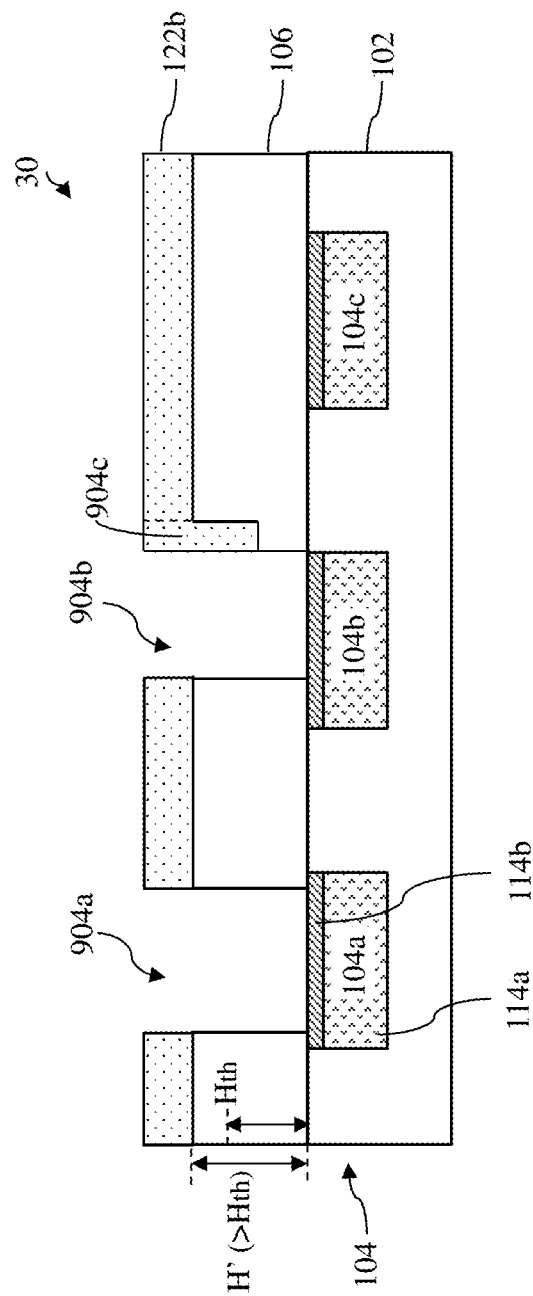
Figure 30:
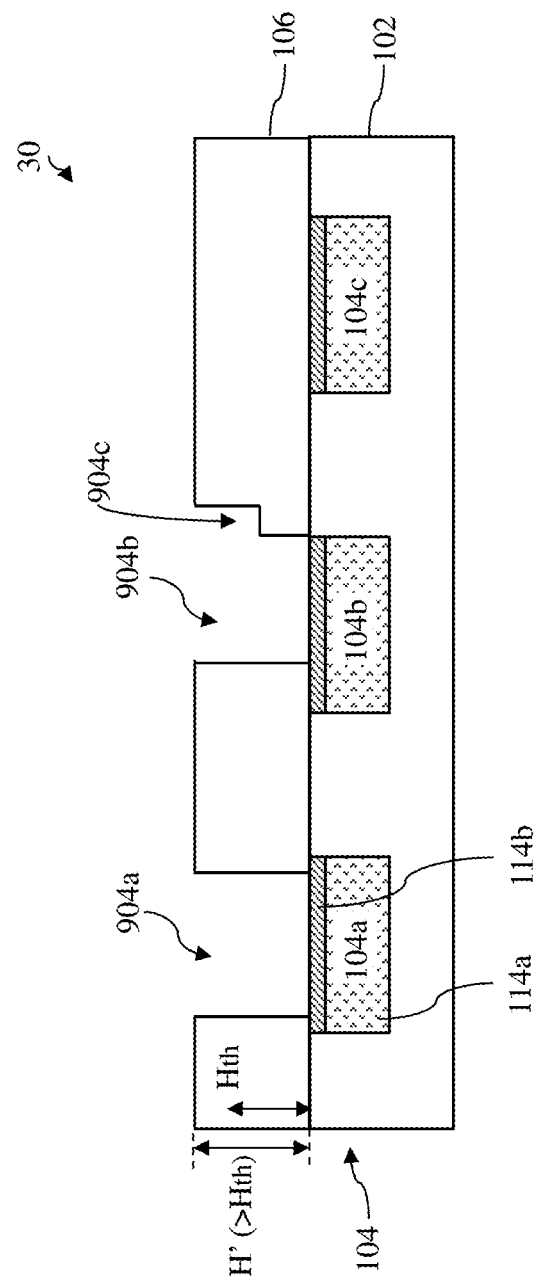

At operation 1018, the method 1000 (FIG. 19B) etches the dielectric layer 106 by using the patterned photoresist layer 122b as an etch mask, thereby transferring a pattern in the patterned photoresist layer 122b to the dielectric layer 106, as shown in FIG. 29. Operation 1018 may include one or more etching processes to remove different portions of the dielectric layer 106, such as a low-k dielectric layer and an etch stop layer to extend the via trenches in the regions 904a and 904b downwardly to the top surface of the conductive features 104a and 104b. The top surface of the conductive features 104a and 104b are exposed in the respective via trenches. The etching process may include any suitable etching technique, such as dry etching, wet etching, or a combination thereof. Other operations may be subsequently implemented. For example, the patterned photoresist layer 122b may be removed by wet stripping or plasma ashing process, as shown in FIG. 30. The plasma ashing process may include using oxygen ($O_2$) plasma or carbon dioxide ($CO_2$) plasma.

Figure 31:
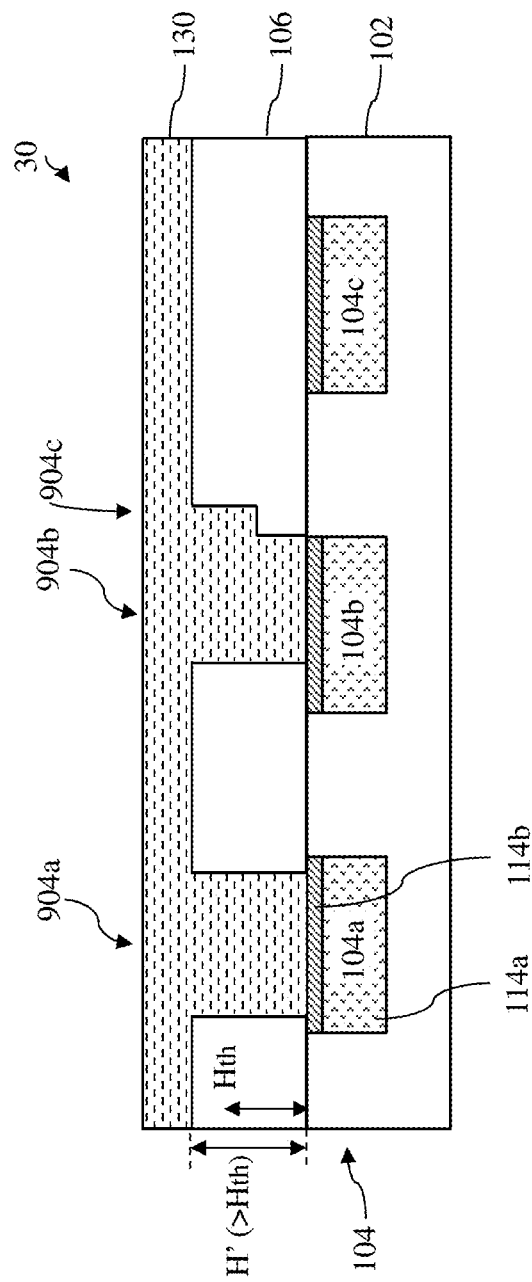

In some embodiments, the conductive features 104 are formed of continuous metallic material or the reflective layer 114b is conductive, the method 1000 (FIG. 19B) may optionally proceed from operation 1018 to operation 1022 by depositing a metal layer 130 to fill the via trenches in the regions 904a-c and covers the dielectric layer 106, as shown in FIG. 31. The metal layer 130 is in direct contact with the top surfaces of the conductive features 104a and 104b. In some embodiments, the metal layer 130 includes Cu, Al, W or other suitable conductive material. In some embodiments, the metal layer 130 includes Cu alloy, such as copper magnesium (CuMn), copper aluminum (CuAl) or copper silicon (CuSi). In some embodiments, the metal layer 130 is deposited by PVD. In some examples, the metal layer 130 is formed by depositing a corresponding metal seed layer using PVD, and then forming a bulk metal layer by plating.

Figure 32:
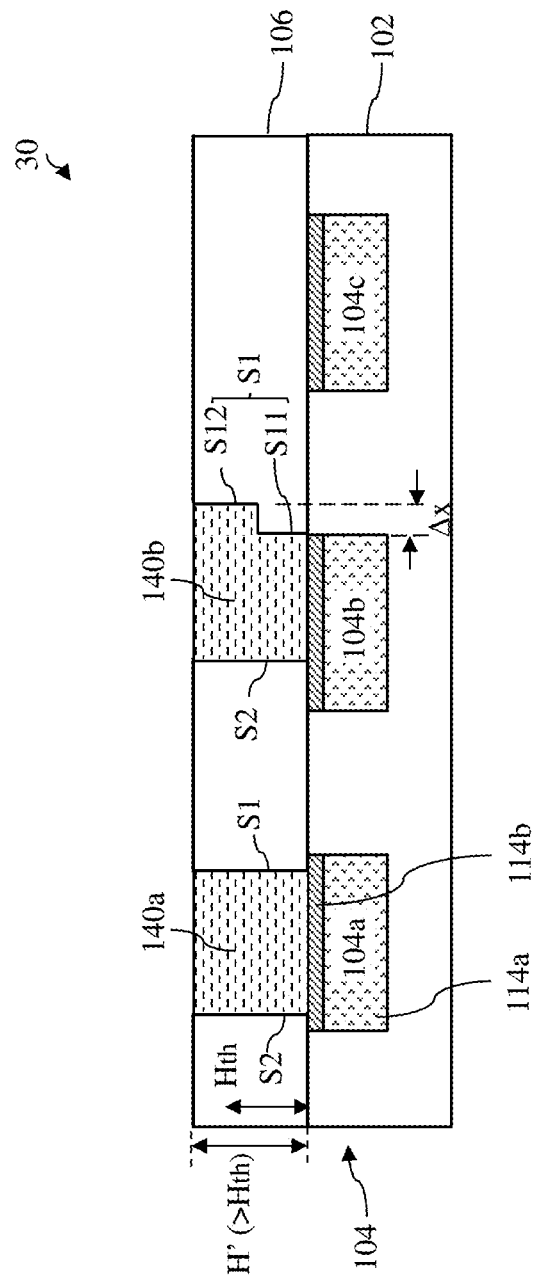

At operation 1024, the method 1000 (FIG. 19B) performs a chemical mechanical polishing (CMP) process to remove the excessive metal layer 130, thereby forming interconnect features 140a and 140b, such as vias 140a and 140b, as shown in FIG. 32. The CMP process may also remove a top portion of the dielectric layer 106, such as a hard mask layer. A substantially coplanar top surface of the interconnect features 140a and 140b and the dielectric layer 106 may be formed after the CMP process. Interconnect feature 140a has two opposing sidewalls S1 and S2 landing on the top surfaces of the conductive features 104a. Both sidewalls S1 and S2 of the interconnect feature 140a have a straight profile. Interconnect feature 140b has two opposing sidewalls S1 and S2 landing on the top surfaces of the conductive features 104b. Sidewall S2 of the interconnect feature 140b has a straight profile. Sidewall S1 of the interconnect feature 104b has a step profile. The step profile includes two vertical sidewall portions S12 and S11 and a horizontal sidewall portion joining the vertical sidewall portions S12 and S11. The upper sidewall portion S12 is offset from an edge of the conductive feature 104b for a distance of Δx. Due to the self-aligned lithography exposure process, the lower sidewall portion S11 substantially aligns with the edge of the conductive feature 104b.

Figure 33:
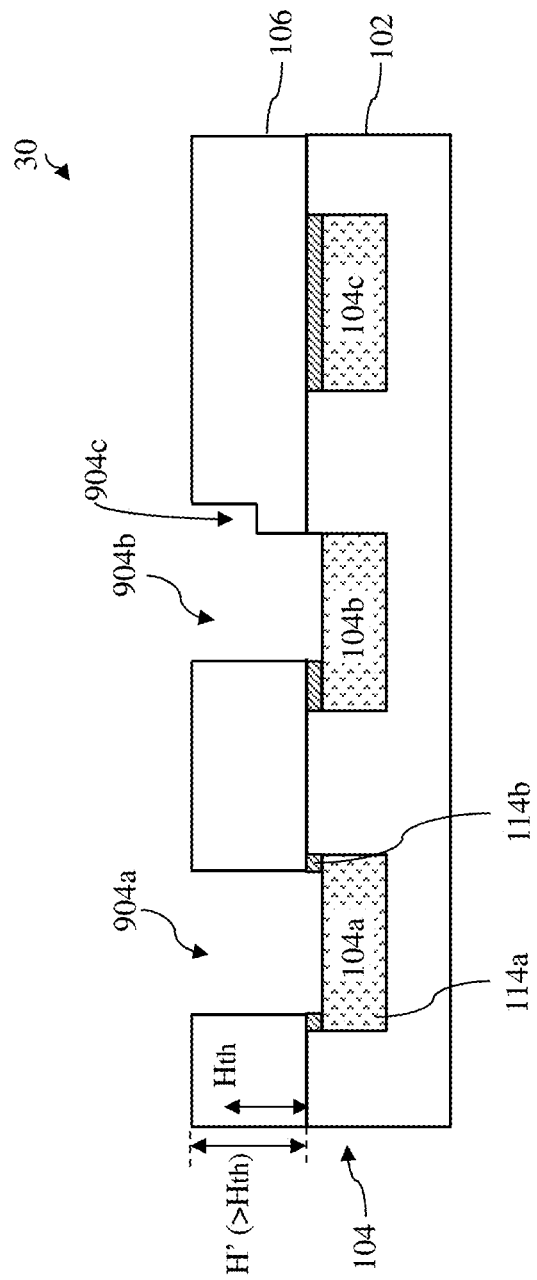

In some embodiments, the reflective layers 114b of the conductive features 104 are formed of high-resist material, non-conductive material, or reflective multilayers, and the method 1000 (FIG. 19B) may optionally proceed from operation 1018 to operation 1020 by selectively etching the reflective layers 114b to expose the underneath high-conductive bulk metal layer 114a in the trenches, as shown in FIG. 33. Operation 1018 includes a selective etching process to remove portions of the reflective layers 114b exposed in the trenches in the regions 904a and 904b. The etch process and the etchant are properly chosen for selective etch without damage to the dielectric layer 106. The etching process may include any suitable etching technique, such as dry etching, wet etching, or a combination thereof. The etching process stops at the bulk metal layer 114a. In the illustrated embodiment, after operation 1020, portions of the reflective layer 114b remain on both ends of the conductive feature 104a, while portions of the reflective layer 114b remain on only one end of the conductive feature 104b.

Figure 34:
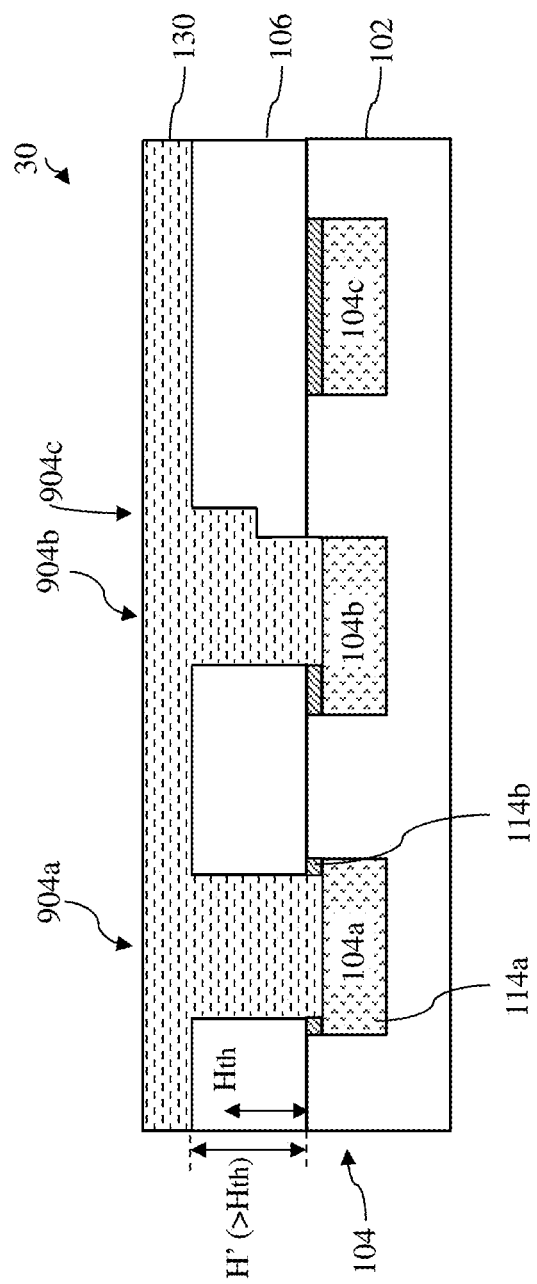
Figure 35:
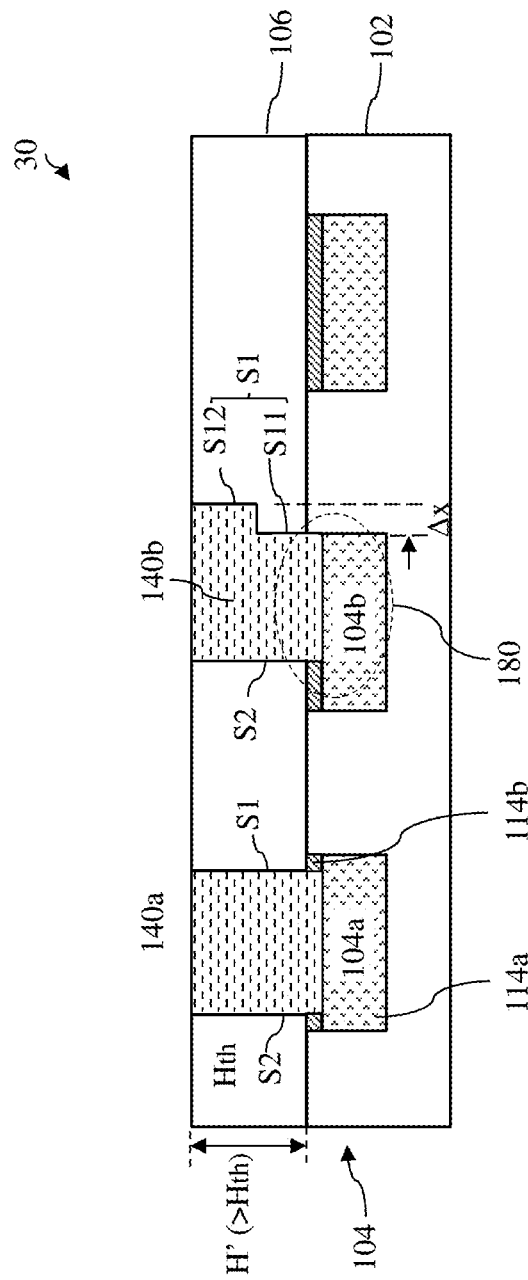

Referring to FIGS. 34 and 35, the method 1000 (FIG. 19B) then proceeds to operations 1022 and 1024 to deposit a metal layer 130 to fill the trenches in regions 904a-c and perform a CMP process to remove the excessive metal layer 130, thereby forming interconnect features 140a and 140b. Interconnect feature 140a has two opposing sidewalls S1 and S2 landing on the top surfaces of the conductive features 104a. Both sidewalls S1 and S2 of the interconnect feature 140a have a straight profile. Interconnect feature 140b has two opposing sidewalls S1 and S2 landing on the top surfaces of the conductive features 104b. Sidewall S2 of the interconnect feature 140b has a straight profile. Sidewall S1 of the interconnect feature 140b has a step profile. The step profile includes two vertical sidewall portions S12 and S11 and a horizontal sidewall portion joining the vertical sidewall portions S12 and S11. The upper sidewall portion S12 is offset from an edge of the conductive feature 104b for a distance of $\Delta x$. Due to the self-aligned lithography exposure process, the lower sidewall portion S11 substantially aligns with the edge of the conductive feature 104b. Bottom portions of the sidewalls S1 and S2 of the interconnect features 140a are covered by the reflective layer 114b. As shown in a region 180 surrounding the interface between the interconnect features 140b and the conductive feature 104b, bottom portion of the sidewall S2 of the interconnect feature 140b is covered by the reflective layer 114b. Bottom portion of the sidewall S1 of the interconnect feature 140b is covered by a top portion of the substrate 102. Upper portions of the sidewalls S1 and S2 of the interconnect features 140a and 140b are covered by the dielectric layer 106.

Figure 36A:
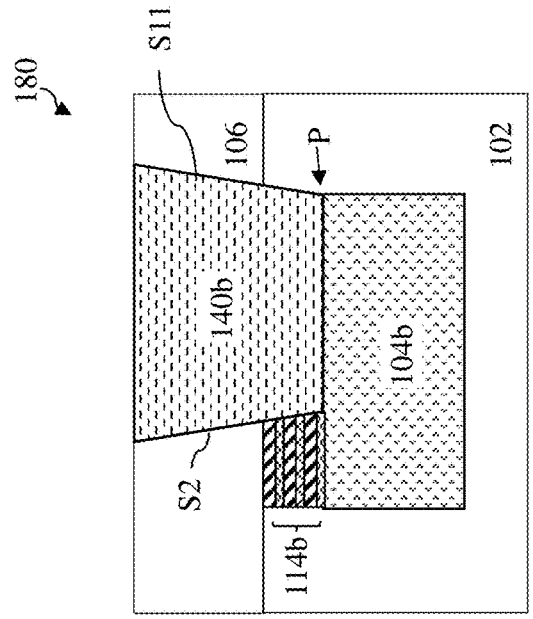
FIGS. 36A, 36B, 36C, and 36D are various cross-sectional views of interfaces between conductive features and interconnect features according to some embodiments of the present disclosure.
Figure 36B:
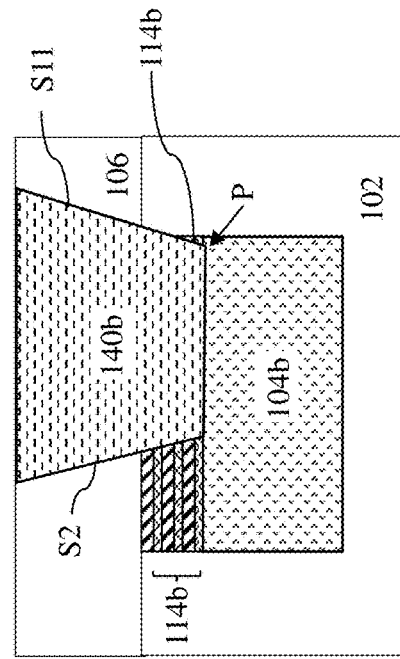
Figure 36C:
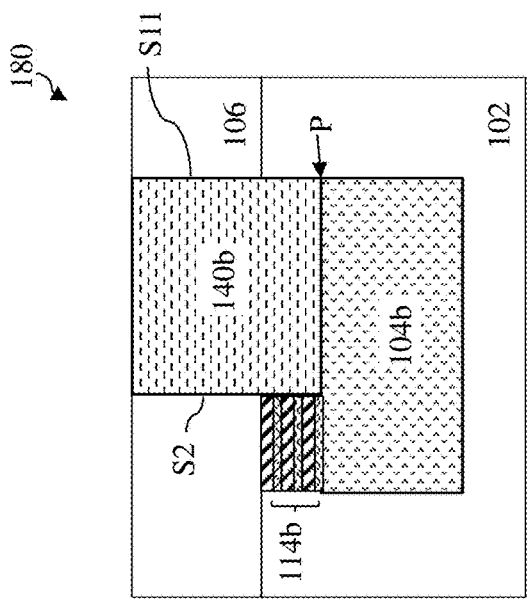
Figure 36D:
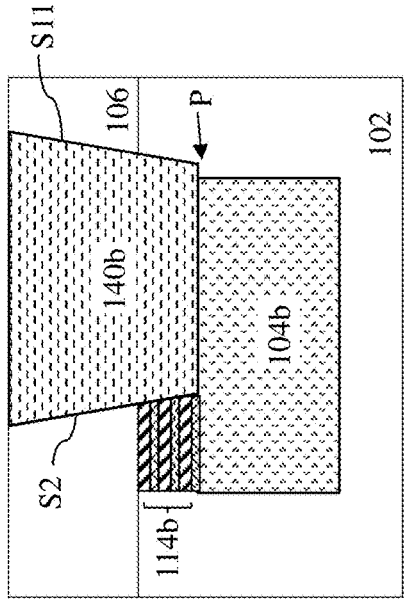

Various embodiments of the interface between the interconnect feature 140b and the conductive feature 104b in the region 180 are shown in FIGS. 36A-D. As discussed above, the interconnect feature 140b has two opposing sidewalls S1 and S2, where sidewall S1 has an upper sidewall portion S12 offset from an edge of the conductive feature 104b and a lower sidewall portion S11. The upper sidewall portion S12 is omitted in FIGS. 36A-D. In FIG. 36A, both sidewalls S2 and S11 are substantially perpendicular to the top surface of the conductive feature 104b. The sidewall S2 lands in the middle of the top surface of the conductive feature 104b, while the sidewall S11 lands at point P, which is substantially at the edge of the conducive feature 104b (i.e., within ±4 nm lateral distance of the edge of the conductive feature 104b, which is less than 20% of a via feature CD size of 20 nm). Bottom portion of the sidewall S2 is covered by the reflective layer 114b, which may be a single reflective layer or a reflective multilayer in various embodiments. Bottom portion of the sidewall S11 is covered by a top portion of the substrate 102. Upper portions of the sidewalls S2 and S11 are covered by the dielectric layer 106. In FIG. 36B, sidewalls S2 and S11 are slanted with respect to the top surface of the conductive feature 104b, which may be due to an etching process in forming the via trench. The sidewall S11 lands at point P, which is at the edge of the conducive feature 104b. In FIG. 36C, the slanted sidewall S11 may land at a point P that is slightly offset from the edge of the conductive feature 104b. The offset may range from about 1 nm to about 5 nm (depending on via feature CD sizes) in some embodiments, which leaves abundant margin to avoid the interconnect feature 140b shorting to adjacent conductive features. In FIG. 36D, the slanted sidewall S11 may land at a point P that is on the top surface of the conductive feature 104b, which is slightly offset in an opposite direction compared with the point P in FIG. 36C. The offset may range from about 1 nm to about 5 nm in some embodiments. As shown in FIG. 36D, the slanted sidewall S11 may chop a top portion of the reflective layer 114b, such that the bottom surface of the sidewall S11 may be cover by a bottom portion of the reflective layer 114b and a top portion of the semiconductor substrate 102. The bottom portion of the reflective layer 114b on the sidewall S11 is lower than the reflective layer 114b on the opposing sidewall S2.

Although not intended to be limiting, one or more embodiments of the present disclosure provide many benefits to a semiconductor device and the formation thereof. For example, embodiments of the present disclosure provide self-aligned interconnect structures that allow for reducing or avoiding effects caused by overlay shift during lithography processes. The present disclosure provides lithography methods that rely on the reflected radiation from underneath conductive features for the right amount of exposure doses in forming latent patterns in a resist layer. The latent patterns are confined in a region directly above the underneath conductive features. The self-aligned methods provide a significant contributor to the overall manufacturing cost reduction, including processing time and the cost of masks used in the lithography process. Further, the various embodiments discussed herein are not limited to forming interconnects in a semiconductor structure, but may be also used to form other structures having alignment and overlay shift issues.

In one exemplary aspect, the present disclosure is directed to a method for lithography patterning. The method includes providing a semiconductor structure including a substrate and a conductive feature formed in a top portion of the substrate; depositing a resist layer over the substrate, wherein the resist layer has an exposure threshold; providing a radiation with an incident exposure dose to the resist layer, wherein the incident exposure dose is configured to be less than the exposure threshold of the resist layer while a sum of the incident exposure dose and a reflected exposure dose from a top surface of the conductive feature is larger than the exposure threshold of the resist layer, thereby forming a latent pattern above the conductive feature; and developing the resist layer to form a patterned resist layer. In some embodiments, the latent pattern is directly above the conductive feature. In some embodiments, the conductive feature includes a reflective layer coated on a bulk metal. In some embodiments, the reflective layer includes a first metal that is different from the bulk metal. In some embodiments, the reflective layer includes a metallic alloy. In some embodiments, the reflective layer includes a plurality of alternating repeating layers. In some embodiments, the method further includes prior to the depositing of the resist layer, forming a dielectric layer over the substrate; after the developing of the resist layer, etching the dielectric layer using the patterned resist layer as an etch mask, thereby forming an opening exposing the top surface of the conductive feature; and depositing a conductive material in the opening, thereby forming a conductive structure landing on the conductive feature. In some embodiments, the conductive feature includes a reflective layer coated on a bulk metal, and the method further includes partially etching the reflective layer to expose the bulk metal such that the conductive structure lands on the bulk metal. In some embodiments, the method further includes prior to the depositing of the resist layer, partially recessing a portion of the resist layer to form a trench above the conductive feature, wherein the resist layer fills the trench. In some embodiments, the radiation is one of a deep ultraviolet (DUV) radiation, an extreme ultraviolet (EUV) radiation, and an electron-beam (E-beam) radiation.

In another exemplary aspect, the present disclosure is directed to a method for lithography patterning. The method includes forming a first conductive feature in a top portion of a substrate; forming a dielectric layer over the substrate; partially recessing the dielectric layer to form a trench above the first conductive feature; coating a resist layer over the dielectric layer, the resist layer filling the trench; exposing the resist layer in a radiation, wherein an incident exposure dose of the radiation is configured such that a latent patent is formed in the trench; developing the resist layer to form an opening in the resist layer; etching the dielectric layer through the opening in the resist layer, thereby extending a portion of the trench through the dielectric layer; and forming a second conductive feature in the trench and in contact with the first conductive feature. In some embodiments, a top portion of the first conductive feature includes a reflective layer. In some embodiments, the reflective layer includes a plurality of alternating first material layers and second material layers. In some embodiments, the method further includes partially etching the reflective layer to expose a bottom portion of the first conducive feature. In some embodiments, the incident exposure dose of the radiation is configured to be less than an exposure threshold of the resist layer while a sum of the incident exposure dose and a reflected exposure dose from a top surface of the first conductive feature is larger than the exposure threshold of the resist layer. In some embodiments, the radiation is a blanket radiation without using a mask. In some embodiments, the radiation is an extreme ultraviolet (EUV) radiation.

In another exemplary aspect, the present disclosure is directed to a semiconductor structure. The semiconductor structure includes a substrate; a first conductive feature embedded in a top portion of the substrate; a dielectric layer over the substrate; and a second conductive feature surrounded by the dielectric layer and in contact with the first conductive feature, the second conductive feature having a first sidewall and a second sidewall opposing the first sidewall, wherein the first sidewall has a straight profile and is above the first conductive feature, and wherein the second sidewall has a step profile and a top portion of the step profile is horizontally offset from an edge of the first conductive feature. In some embodiments, the first conductive feature includes a reflective layer, and wherein a bottom portion of the first sidewall is covered by the reflective layer. In some embodiments, a bottom portion of the step profile substantially aligns with the edge of the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithography patterning, comprising:
providing a semiconductor structure including a substrate and a conductive feature formed in a top portion of the substrate;
depositing a resist layer over the substrate, wherein the resist layer has an exposure threshold;
providing a radiation with an incident exposure dose through a photomask to the resist layer, wherein the incident exposure dose is configured to be less than the exposure threshold of the resist layer while a sum of the incident exposure dose and a reflected exposure dose from a top surface of the conductive feature is larger than the exposure threshold of the resist layer, thereby forming a latent pattern above the conductive feature; and
developing the resist layer to form a patterned resist layer.

2. The method of claim 1, wherein the latent pattern is directly above the conductive feature.

3. The method of claim 1, wherein the conductive feature includes a reflective layer coated on a bulk metal.

4. The method of claim 3, wherein the reflective layer includes a first metal that is different from the bulk metal.

5. The method of claim 3, wherein the reflective layer includes a metallic alloy.

6. The method of claim 3, wherein the reflective layer includes a plurality of alternating repeating layers.

7. The method of claim 1, further comprising:
prior to the depositing of the resist layer, forming a dielectric layer over the substrate;
after the developing of the resist layer, etching the dielectric layer using the patterned resist layer as an etch mask, thereby forming an opening exposing the top surface of the conductive feature; and
depositing a conductive material in the opening, thereby forming a conductive structure landing on the conductive feature.

8. The method of claim 7, wherein the conductive feature includes a reflective layer coated on a bulk metal, further comprising:
partially etching the reflective layer to expose the bulk metal such that the conductive structure lands on the bulk metal.

9. The method of claim 7, further comprising:
prior to the depositing of the resist layer, partially recessing a portion of the dielectric layer to form a trench above the conductive feature, wherein the resist layer fills the trench.

10. The method of claim 1, wherein the radiation is one of a deep ultraviolet (DUV) radiation, an extreme ultraviolet (EUV) radiation, and an electron-beam (E-beam) radiation.

11. A method for lithography patterning, comprising:
forming a first conductive feature in a top portion of a substrate;
forming a dielectric layer over the substrate;
partially recessing the dielectric layer to form a trench above the first conductive feature;
coating a resist layer over the dielectric layer, the resist layer filling the trench;
exposing the resist layer in a radiation, wherein an incident exposure dose of the radiation is configured such that a latent patent is formed in the trench;

developing the resist layer to form an opening in the resist layer;

etching the dielectric layer through the opening in the resist layer, thereby extending a portion of the trench through the dielectric layer; and forming a second conductive feature in the trench and in contact with the first conductive feature.

12. The method of claim 11, wherein a top portion of the first conductive feature includes a reflective layer.

13. The method of claim 12, wherein the reflective layer includes a plurality of alternating first material layers and second material layers.

14. The method of claim 12, further comprising:

partially etching the reflective layer to expose a bottom portion of the first conducive feature.

15. The method of claim 11, wherein the incident exposure dose of the radiation is configured to be less than an exposure threshold of the resist layer while a sum of the incident exposure dose and a reflected exposure dose from a top surface of the first conductive feature is larger than the exposure threshold of the resist layer.

16. The method of claim 11, wherein the radiation is a blanket radiation without using a mask.

17. The method of claim 11, wherein the radiation is an extreme ultraviolet (EUV) radiation.

18. A semiconductor structure, comprising:

a substrate;

a first conductive feature embedded in a top portion of the substrate, the first conductive feature having a first edge and a second edge opposing the first edge;

a dielectric layer over the substrate; and a second conductive feature surrounded by the dielectric layer and in contact with the first conductive feature, the second conductive feature having a first sidewall and a second sidewall opposing the first sidewall, wherein the second sidewall is proximal to the second edge of the first conductive feature and distal to the first edge of the first conductive feature, wherein the first sidewall has a straight profile and is directly above the first conductive feature and horizontally offset from the first edge of the first conductive feature, and wherein the second sidewall has a step profile and a top portion of the step profile is horizontally offset from the second edge of the first conductive feature.

19. The semiconductor structure of claim 18, wherein the first conductive feature includes a reflective layer, and wherein a bottom portion of the first sidewall is covered by the reflective layer.

20. The semiconductor structure of claim 18, wherein a bottom portion of the step profile substantially aligns with the second edge of the first conductive feature.

* * * * *